United States Patent
Kato et al.

(10) Patent No.: US 6,829,099 B2
(45) Date of Patent: Dec. 7, 2004

(54) PROJECTION OPTICAL SYSTEM AND PROJECTION EXPOSURE APPARATUS

(75) Inventors: Takashi Kato, Utsunomiya (JP); Chiaki Terasawa, Utsunomiya (JP); Hiroyuki Ishii, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/820,710

(22) Filed: Mar. 30, 2001

(65) Prior Publication Data

US 2002/0008855 A1 Jan. 24, 2002

(30) Foreign Application Priority Data

Mar. 31, 2000 (JP) .................................. 2000-096934
Mar. 1, 2001 (JP) .................................. 2001-057369

(51) Int. Cl.[7] .................. G02B 3/00; G02B 9/00
(52) U.S. Cl. .................. 359/650; 359/569; 359/364; 359/730; 355/53
(58) Field of Search .................. 359/565, 566, 359/364, 365, 649, 650, 651, 726–730; 355/53, 67

(56) References Cited

U.S. PATENT DOCUMENTS

| 5,287,218 A | * | 2/1994 | Chen ........................... 359/365 |
| 5,345,292 A | | 9/1994 | Shiozawa et al. ............. 355/67 |
| 5,515,207 A | * | 5/1996 | Foo ............................. 359/731 |
| 5,555,497 A | | 9/1996 | Helbling ..................... 364/401 |
| 5,621,497 A | | 4/1997 | Terasawa et al. ............. 355/53 |
| 5,623,365 A | | 4/1997 | Kuba ........................... 359/569 |
| 5,631,721 A | * | 5/1997 | Stanton et al. ................ 355/71 |
| 5,633,713 A | | 5/1997 | Tanaka et al. ............... 356/355 |
| 5,661,604 A | | 8/1997 | Kuba ........................... 359/637 |
| 5,673,103 A | | 9/1997 | Inoue et al. .................. 355/71 |
| 5,691,802 A | | 11/1997 | Takahashi .................... 355/53 |
| 5,754,340 A | | 5/1998 | Ushida et al. ............... 359/566 |
| 5,825,553 A | | 10/1998 | Chen ........................... 359/643 |
| 5,969,882 A | | 10/1999 | Takahashi .................... 359/728 |
| 5,999,310 A | * | 12/1999 | Shafer et al. ................ 359/351 |
| 6,285,855 B1 | | 9/2001 | Tsuji ........................... 399/618 |
| 6,307,618 B1 | | 10/2001 | Suzuki et al. ................ 355/53 |

FOREIGN PATENT DOCUMENTS

| EP | 0 828 172 | 3/1998 |
| EP | 1079253 A1 | 2/2001 |
| JP | 6-27382 | 2/1994 |
| JP | 6-331941 | 12/1994 |
| JP | 7-128590 | 5/1995 |
| JP | 7-181391 | 7/1995 |
| JP | 7-218844 | 8/1995 |
| JP | 8-17720 | 1/1996 |
| JP | 8-78319 | 3/1996 |
| JP | 8-304705 | 11/1996 |
| JP | 10-79345 | 3/1998 |
| JP | 10-308345 | 11/1998 |
| JP | 11-109244 | 4/1999 |
| JP | 11-354436 | 12/1999 |
| JP | 2000-12440 | 1/2000 |

OTHER PUBLICATIONS

U.S. patent application Ser. No. 09/337,258, Suzuki et al., filed Jun. 22, 1999.

* cited by examiner

Primary Examiner—Mark A. Robinson
Assistant Examiner—Alessandro Amari
(74) Attorney, Agent, or Firm—Fitzpatrick, Cella, Harper & Scinto

(57) ABSTRACT

A projection optical system includes at least one lens, at least one concave mirror, at least one diffractive optical element, a first imaging optical system that includes the at least one lens and the at least one concave mirror, for imaging an intermediate image of an object, a second imaging optical system, having the at least one lens and the at least one diffractive optical element, for projecting the intermediate image onto an image plane, and a field optical system disposed between the first and second imaging optical systems.

28 Claims, 11 Drawing Sheets

SPHERICAL ABERRATION     ASTIGMATISM     DISTORTION (%)

PROJECTION OPTICAL SYSTEM AND PROJECTION EXPOSURE APPARATUS

FIELD OF THE INVENTION AND RELATED ART

This invention relates to a projection optical system, a projection exposure apparatus having a projection optical system, and a device manufacturing method. More particularly, the invention concerns a catadioptric projection optical system which uses a concave reflection mirror, for example, in a projection optical system for printing, by projection exposure, a reticle pattern on a semiconductor wafer.

Recent advancement in semiconductor device manufacturing technology is quite notable, and micro-processing technology following it also has advanced remarkably. Particularly, in the photo-processing technology, reduction projection exposure apparatuses having a resolution of sub-micron order and called steppers or scanners, are used widely. For further improvements of resolving power, enlargement of the numerical aperture (NA) of the optical system or shortening of the exposure wavelengths are attempted.

As regards imaging optical systems used in projection exposure apparatuses for printing a semiconductor device pattern such as an IC or LSI on a silicon wafer, for example, a very high resolving power is required. Generally, the resolving power of an imaging optical system is better as the wavelength used is shorter. For this reason, light sources which emit light of shorter wavelengths as much as possible are used. As an example of such a short wavelength light source, excimer lasers are known. These excimer lasers use KrF or ArF, for example, as the laser medium. Also, there is an $F_2$ laser which is expected as a next generation laser of the ArF laser.

In relation to the wavelength regions of these light sources, glass materials usable as a lens material are limited to quartz and fluorite. This is mainly because of the decrease in the transmission factor. Further, even with such quartz or fluorite usable in the wavelength regions of these light sources, as discussed in Japanese Laid-Open Patent Application, Laid-Open No. 79345/1998, for example, if the optical system consists of refraction lenses only and the number of lenses is large so that the total glass material thickness is large, there may occur problems such as a shift of the focal point position, for example, due to heat absorption of the lenses. Further, in recent projection optical systems, a larger numerical aperture and a wider exposure range are strongly desired, and this raises the necessity of further increasing the number of lenses used. This results in a decrease of the transmission factor and an increase of the cost of glass materials. Further, if the band-narrowing of a laser is insufficient, correction of chromatic aberration must be made. This needs achromatism based on a combination of refracting lenses in an optical system, for the correction of chromatic aberration. Also, this leads to a further increase of the number of lenses used.

Japanese Laid-Open Patent Application, Laid-Open No. 331941/1994 corresponding to U.S. Pat. No. 5,623,365 and Japanese Laid-Open Patent Application, Laid-Open No. 128590/1995 corresponding to U.S. Pat. No. 5,555,497, show an optical arrangement in which, for correction of chromatic aberration, a diffractive optical element is introduced into a projection optical system comprising dioptric systems. In this optical arrangement, a diffractive optical element having a dispersion inverse to that of an ordinary refracting lens is introduced and placed adjacent to a pupil of a dioptric projection optical system, by which axial chromatic aberration is mainly corrected. Also, by means of an aspherical surface effect of the diffractive optical element, aberrations such as spherical aberration and coma are mainly corrected.

The diffractive optical element is an optical element for converting an incident wavefront into a predetermined wavefront. It has unique features which refracting lenses do not have. For example, since it has a dispersion value inverse to a refracting lens or it has substantially no thickness, the optical system can be made very compact, as an example.

As a method producing a diffrative optical element having such features very precisely, binary optics have attracted attention, for example. This is because a semiconductor process used in the manufacture of an LSI, for example, can be applied to it by approximating a Kinoform shape by a step-like shape, such that even a very small pitch can be produced easily and very precisely.

Japanese Laid-Open Patent Application, Laid-Open No. 78319/1996 corresponding to U.S. Pat. No. 5,754,340 shows an optical system having diffractive optical elements, quartz lenses and fluorite lenses, in which at least one diffractive optical element has a positive refractive power, at least one quartz lens has a negative refractive power, and at least one fluorite lens has a positive refractive power. This is intended particularly to reduce a secondary spectrum of chromatic aberration.

Japanese Laid-Open Patent Application, Laid-Open No. 17720/1996 shows an optical system in which a diffractive optical element is introduced into a catoptric system. This optical system includes diffractive optical elements and reflecting members each having a curved reflection surface. The diffractive optical element is provided on the reflection surface. It is stated in this document that the role having been taken by a refracting lens is played by a diffractive optical element, by which a projection optical system of a reduced magnification is accomplished only by the combination of reflection surfaces and diffractive optical elements. Also, it is stated that, since the diffractive optical element has a dispersion corresponding to the bandwidth of light to be used for the projection exposure, in the paraxial region, it is desirable to use the same while keeping its refractive power nearly at zero, that is, at an infinite focal length. Thus, this structure proposes an optical system which can be used in a short wavelength region in which no refracting lens can be used.

Further, many proposals have been made with respect to a combination of a dioptric system and a catoptric system, that is, a catadioptric system. These optical systems are intended to correct chromatic aberration or any other aberrations by a combination of a mirror and a refracting lens, and no diffractive optical element is used.

Among them, Japanese Laid-Open Patent Application, Laid-Open No. 304705/1996 corresponding to U.S. Pat. No. 5,691,802 shows an optical system constituted by a double-imaging (twice-imaging) system, in which a first imaging system includes one concave mirror and a refracting lens so that an intermediate image of a reticle formed by the first imaging system is imaged upon a wafer by a second imaging system which comprises refracting lenses.

According to the structure of this document, a flat mirror is disposed adjacent to the intermediate image formed by the first imaging system, to deflect the advancement direction (optical axis) of the light by 90 degrees toward the second imaging system. Also, a reflection mirror is provided in the second imaging system so that the wafer surface and the reticle surface are held parallel to each other. This optical system accomplishes scanning exposure by using an abaxial light beam and by scanning the reticle and the wafer in synchronism with each other.

The optical system shown in Japanese Laid-Open Patent Application, Laid-Open No. 331941/1994, mentioned above, in which a diffractive optical element is introduced into a dioptric system, needs a large number of lenses, due to the necessity for aberration correction. Thus, there is a possibility that, due to the influence of thermal aberration or the like, the performance of the projection optical system is degraded. Further, when the wavelength of the exposure light is shortened much more, the influence of the thermal aberration or the like becomes much more notable.

The optical system shown in Japanese Laid-Open Patent Application, Laid-Open No. 128590/1995 mentioned above needs a smaller number of elements, but the exposure range is narrow and the numerical aperture of the optical system is small. Therefore, in order to widen the exposure range and to enlarge the numerical aperture, a large increase of the number of lenses is inevitable.

The optical system shown in Japanese Laid-Open Patent Application, Laid-Open No. 78319/1996, mentioned above, uses refracting lenses and diffractive optical elements, in which at least one diffractive optical element has a positive refractive power, at least one quartz lens has a negative refractive power, and at least one fluorite lens has a positive refractive power. However, for better correction of chromatic aberration and other aberrations to accomplish an optical system having a high resolving power and a wide exposure region, this optical system still requires a large number of refracting lenses, similarly. Yet, no specific numerical example is discussed there.

As regards the optical system shown in Japanese Laid-Open Patent Application, Laid-Open No. 17720/1996 mentioned above, no specific numeral example is disclosed. Since the aspherical effect of the diffractive optical element is used because, as long as stated there, the power thereof should desirably be held closed to zero, the mirror owns the refractive power of the optical system. Also, there is no lens used as a refracting lens. For these reasons, a large numerical aperture and a wide exposure range are not attainable with this optical system.

In the optical system shown in Japanese Laid-Open Patent Application, Laid-Open No. 304705/1996 mentioned above, aberration correction is made such that the aberration produced by the first imaging system is cancelled by the second imaging system. For example, in the first imaging system, a concave mirror and a negative lens disposed adjacent to the concave mirror function to produce an "over" image field curvature, while on the other hand, the negative lens produces axial chromatic aberration in the "over" direction. In order to cancel them, the second imaging system is constituted by a refracting lens group. By means of its lenses having a positive power, "under" image field curvature and axial chromatic aberration are produced, by which the aberration correction as a total system is accomplished. However, because of the necessity of correcting the chromatic aberration and the image field curvature concurrently and also correcting any other aberrations, the first imaging system should include many lenses. Particularly, as regards the refracting lenses used in the first imaging system as a reciprocal optical system, unless the number of them are reduced as much as possible, the total thickness of the optical system becomes large and the transmission factor decreases. There arises a large influence of the thermal aberration and the like.

If, on the other hand, the optical system is to be provided by a catoptric system in which only reflection mirrors being free from chromatic aberration are used, it becomes very difficult to design and produce one having a high numerical aperture.

SUMMARY OF THE INVENTION

It is accordingly an object of the present invention to provide an improved projection optical system by which a large numerical aperture and a wide exposure area are assured.

In accordance with an aspect of the present invention, there is provided a projection optical system, a projection exposure apparatus or a device manufacturing method, which has a feature according to any one of items (1)–(15) below.

(1) A projection optical system, comprising: at least one lens; at least one concave mirror; and at least one diffractive optical element.

(2) A projection optical system according to item (1) wherein said at least one lens, said at least one concave mirror and said at least one diffractive optical element have a positive refractive power, respectively, and wherein said projection optical system does not include a lens having a negative refractive power, a mirror having a negative refractive power or a diffractive optical element having a negative refractive power.

(3) A projection optical system according to item (1) wherein said at least one lens, said at least one concave mirror and said at least one diffractive optical element include a lens, a concave mirror and a diffractive optical element of a positive refractive power.

(4) A projection optical system according to any one of items (1)–(3), wherein said projection optical system includes a first imaging optical system having said at least one lens and said at least one concave mirror, for imaging an intermediate image of an object, and a second imaging optical system having said at least one lens and at least one diffractive optical element, for projecting the intermediate image onto an image plane.

(5) A projection optical system according to item (4) wherein said first and second imaging optical systems are disposed along a common straight optical axis, and wherein abaxial light from the object as reflected and collected by said concave mirror is caused by said mirror to pass through an outside portion of an effective diameter of said concave mirror, toward the image plane side.

(6) A projection optical system according to item (4) or (5), further comprising a field optical system disposed between said first and second imaging optical systems.

(7) A projection optical system according to item (5) or (6), wherein said first imaging optical system includes at least a lens having a positive refractive power, said reflection mirror and said concave mirror, which are disposed in the order mentioned above, from the object side.

(8) A projection optical system according to item (7), further comprising a lens group disposed between said reflection mirror and said concave mirror.

(9) A projection optical system according to item (8), wherein said lens group has a negative refractive power and is disposed between said concave mirror and a lens, in said first imaging optical system, having a positive refractive power.

(10) A projection optical system according to item (4), further comprising a reflection surface disposed adjacent to an intermediate image formed by said first imaging optical system, and wherein abaxial light from the object as reflected and collected by said concave mirror is deflected by said reflection surface toward said second imaging optical system.

(11) A projection optical system according to any one of items (1)–(10), wherein at least one of the diffractive optical elements of said projection optical system satisfies a relation:

$$3 < MP/\lambda < 50$$

where MP is a minimum pitch (micron) of the diffractive optical element, and $\lambda$ is the exposure wavelength (micron).

(12) A projection optical system according to any one of items (1)–(10), wherein at least one of the diffractive optical elements of said projection optical system satisfies a relation:

$$|Ld/Lg2| < 0.2$$

where Ld is the distance between an aperture stop of said second imaging optical system and said diffractive optical element, and Lg2 is the distance from a paraxial image plane position of an intermediate image formed by said first imaging optical system, corresponding to an object point position of said second imaging optical system, to a re-imaging plane where the intermediate image is re-imaged.

(13) A projection optical system according to any one of items (3)–(12), further comprising a field stop adjacent to an intermediate image to be formed by said first imaging optical system.

(14) A projection exposure apparatus for projecting a pattern of a mask onto a substrate by use of a projection optical system as recited in any one of items (1)–(13).

(15) A device manufacturing method, comprising the steps of: exposing a wafer to a device pattern; and developing the exposed wafer.

(16) A method according to item (15), wherein the exposure step uses laser light from one of an ArF excimer laser and an $F_2$ excimer laser.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
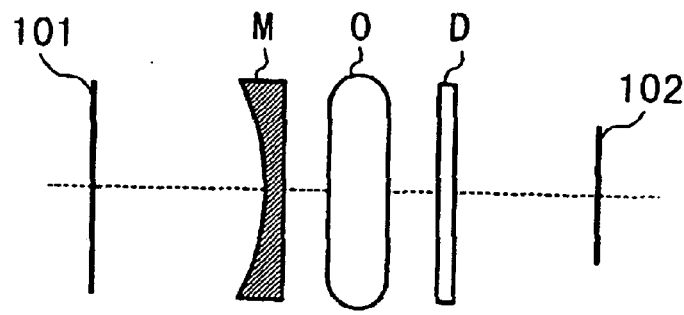
FIG. 1 is a schematic view for explaining a projection optical system according to an embodiment of the present invention.

In accordance with an embodiment of the present invention, a projection optical system such as shown in FIG. 1 may be provided on the basis of the above-described structure (first embodiment). This embodiment accomplishes a projection optical system having a reduced number of lenses and assuring a high resolving power and a wide exposure region. Referring to the schematic view of it in FIG. 1, denoted at 101 is a first object (reticle), and denoted at 102 is a second object (wafer). In FIG. 1, denoted at M is a mirror, and denoted at O is a refracting lens. Denoted at D is a diffractive optical element. As shown in FIG. 1, the projection optical system of this embodiment includes at least a refracting lens, a mirror and a diffractive optical element. All the elements in this optical system having a focal length, that is, the refracting lens, the mirror and the diffractive optical element have positive focal lengths. This enables a projection optical system having a small number of lenses and assuring a high resolving power and a wide exposure region.

Details of it will be described below.

Generally, in an optical system, various aberrations (chromatic aberration, image field curvature, etc.) are corrected by combining optical elements having positive and negative refractive powers. Therefore, in order to obtain an optical system in which aberrations are corrected with respect to a higher numerical aperture and a wider exposure range, it necessarily needs a large number of optical elements having positive and negative refractive powers.

To the contrary, if it is possible to provide an optical system in which the number of optical elements of negative refractive power is reduced as much as possible and also in which aberrations are corrected with respect to a high numerical aperture and a wide exposure range, the number of lenses of such optical system can be made very small.

For simple discussion on this point, a thin contact system will now be considered. Here, it is assumed that $\phi_{0-}$ is a composite negative refractive power of a refracting lens (lenses), $\phi_{0-}$ is an Abbe constant and $n_-$ is a refractive index of it. Also, it is assumed that $\phi_{0+}$ is a composite positive refractive power of a refracting lens (lenses), $\nu_{0+}$ is an Abbe constant and $n_+$ is a refractive index of it. Further, it is assumed that $\phi_m$ is a composite refractive power of a mirror (mirrors), $\phi_d$ is a composite refractive power of a diffractive optical element (elements), and $\nu_d$ is an Abbe constant of it.

In designing an optical system, what is to be satisfied first are the correction of curvature of field and chromatic aberration. Since these aberrations largely depend upon the power arrangement of the optical system, they should be considered sufficiently at the initial stage of the designing.

In order to obtain an optical system in which the field curvature and the chromatic aberrations are corrected satisfactorily, the optical system should include a lens having a positive refractive power and a lens having a negative refractive power.

Particularly, when the optical elements constituting an optical system are all refracting lenses, an index F representing the field curvature as well as an index C representing the chromatic aberration can be expressed by equations (1) and (2) below.

$$F = \phi_{0+}/n_+ + \phi_{0-}/n_- \tag{1}$$

$$C = \phi_{0+}/\nu_{0+} + \phi_{0-}/\nu_{0-} \tag{2}$$

It is seen from equations (1) and (2) above that, if the optical system does not include any element having a negative refractive power, the indices F and C are determined only by those elements having a positive refractive power, and therefore, neither of them can be made small or zero.

Since the usable glass materials are limited in the short wavelength region, as described hereinbefore, correction of chromatic aberration is difficult to accomplish. Additionally, in order to obtain an optical system having a wide exposure region and a high numerical aperture, the number of lenses with a positive refractive power as well as the number of lenses with a negative refractive power have to be increased considerably.

When an optical system is constituted by a refracting lens (lenses) and a diffractive optical element (elements), the indices F and C are given by equations (3) and (4) below. It is seen from equations (3) and (4) below that, in order to correct the chromatic aberration C and the field curvature F at once, the optical system inevitably needs a lens (lenses) having a negative refractive power. This is because the diffractive optical element itself does not contribute to the field curvature.

$$F = \phi_{0+}/n_+ + \phi_{0-}/n_- \tag{3}$$

$$C = \phi_{0+}/\nu_{0+} + \phi_{0-}/\nu_{0-} + \phi_d/\nu_d \tag{4}$$

Further, in an optical system which is constituted by a mirror (mirrors) and a refracting lens (lenses), as seen from equations (5) and (6) below, in order to correct chromatic aberration C and field curvature F at the same time, the optical system inevitably needs a lens (lenses) having a negative refractive power. This is because the mirror itself does not contribute to correction of chromatic aberration.

$$F = \phi_{0+}/n_+ + \phi_{0-}/n_- + \phi_m \tag{5}$$

$$C = \phi_{0+}/\nu_{0+} + \phi_{0-}/\nu_{0-} \tag{6}$$

In consideration of the above, if the optical system is constituted by a refracting lens (lenses), a diffractive optical element (elements) and a mirror (mirrors) as in the present invention, the indices F and C can be expressed by equations (7) and (8) below.

$$F = \phi_{0+}/n_+ + \phi_{0-}/n_- + \phi_m \tag{7}$$

$$C = \phi_{0+}/\nu_{0+} + \phi_{0-}/\nu_{0-} + \phi_d/\nu_d \tag{8}$$

As described above, since the diffractive optical element itself does not produce a field curvature, what determines the field curvature are the mirror and the refracting lens. Further, since the mirror does not contribute to correction of chromatic aberration, the refracting lens and the diffractive optical element function to correct the same. Thus, when a projection optical system formed by use of three kinds of elements of refracting lens, mirror and diffractive optical element, if a lens (lenses) having a negative refractive power is prevented from being used in the optical system, the results are as follows.

$$F = \phi_{0+}/n_+ + \phi_m \tag{7'}$$

$$C = \phi_{0+}/\nu_{0+} + \phi_d/\nu_d \tag{8'}$$

By using these three elements of refracting lens, mirror and diffractive optical element in this manner while satisfying the above-described two equations, the field curvature and chromatic aberration can be corrected. Namely, an optical system can be structured without use of a lens having a negative refractive power, which is inevitably required in conventional optical systems. In this case, for correction of chromatic aberration, the optical system may comprise a lens having a positive refractive power and a diffractive optical element having a positive refractive power as well as a mirror (concave mirror) having a positive refractive power for cancelling a negative field curvature produced by the lens of positive refractive power. This enables an optical system without use of a lens and an element having a negative refractive power.

As described above, a projection optical system may comprise at least a refracting lens, a mirror and a diffractive optical element, wherein each of the elements having a focal length, that is, refracting lens, mirror and diffractive optical element, may have a positive refractive power. This structure enables correction of image field curvature and chromatic aberration in the whole system, and also it assures an optical system with a reduced number of elements.

Figure 2:
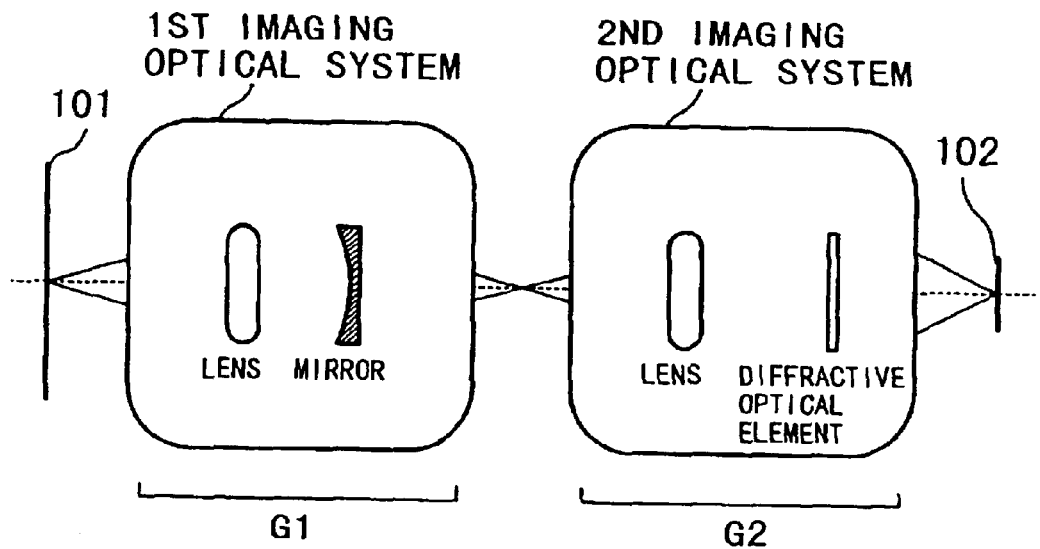
FIG. 2 is a schematic view for explaining a projection optical system according to another embodiment of the present invention.

In accordance with another embodiment of the present invention, a catadioptric projection optical system such as shown in FIG. 2 may be provided on the basis of the above-described structure (second embodiment). Denoted in FIG. 2 at 101 is a first object (reticle), and denoted at 102 is a second object (wafer). The optical system of this embodiment includes at least a first imaging optical system G1 and a second imaging optical system G2, in an order from the object side. The first imaging optical system G1 includes a refracting lens and a mirror, and it serves to form an intermediate image of the first object 101. The second imaging optical system G2 includes a refracting lens and a diffractive optical element, and it functions to re-image the intermediate image, described above, upon the second object 102.

Generally, a mirror has features as follows:
(i) No chromatic aberration is produced at a mirror surface.
(ii) The relationship in sign between the power of the mirror and the Petzval sum is inverse to that of an ordinary refracting lens. For example, since a concave mirror may have a positive power while its Petzval sum may have a negative value, the load of power to a negative lens in the optical system for correction of the Petzval sum can be reduced.

Use of a mirror having such features in an optical system is advantageous in optical design, and it is an effective measure to construct an optical system having less chromatic aberration and a smaller number of elements.

However, because of reflection of light at the mirror surface, there arise several problems. Particularly, when a mirror is used in a single-imaging optical system, it is necessary that the light incident on the mirror and the light emitted from it are separated from each other when imaged upon an image plane. To this end, a beam splitter should be used, for example. Alternatively, an optical system should be arranged to produce a void in its pull.

Further, generally, if in a multiple-imaging optical system a mirror is disposed in a final imaging optical system, it is difficult to keep a sufficient back focus, and therefore, the optical arrangement for separating the light incident on the mirror and the light emitted from each other becomes complicated. Here, the final imaging optical system is one of the imaging systems which is closest to the second object (wafer) in FIG. 1. Additionally, if a larger numerical aperture is desired, the arrangement becomes more strict and, on the other hand, the size of the mirror becomes larger. In consideration of them, in a multiple-imaging optical system, a mirror should desirably be placed on an imaging optical system other than the final imaging optical system.

In this embodiment of the present invention, in consideration of it, at least one mirror is provided in an imaging optical system other than the final imaging optical system, more particularly, in the first imaging optical system G1.

Generally, a diffractive optical element has features as follows:

(i) It has a dispersion of a sign inverse to that of an ordinary lens.

(ii) It does not produce field curvature (zero Petzval sum).

Thus, although a mirror has a feature that it does not produce chromatic aberration as a characteristic thereof and it has a relation between the power and the Petzval sum of a sign inverse to that of an ordinary refracting lens, a diffractive optical element has features that the dispersion is inverse to an ordinary refracting lens whereas the Petzval sum is zero.

In consideration of the differences in structural components of an optical system as described above, the following conclusions are obtained:

(a) When the optical elements constituting an optical system are all refracting lenses, in order that both the field curvature and the chromatic aberration are corrected at once in an optical system having a large numerical aperture and a wide exposure range, it needs use of a large number of refracting lenses. One reason for this is that the glass materials usable in the short wavelength region are very limited, and currently available glass materials usable with the ArF wavelength are quartz and fluorite only, while, as regards the $F_2$ wavelength, only fluorite has a high transmission factor. Particularly, in relation to the $F_2$ wavelength, as long as the fluorite is the only glass material usable therewith, there remains chromatic aberration unless the $F_2$ laser is band-narrowed sufficiently to reduce the chromatic aberration satisfactorily. Further, for correction of field curvature, a refracting lens having a positive refractive power and a refracting lens having a negative refractive power should be used effectively. This inevitably results in an increase in the number of lens elements in the optical system having a large numerical aperture and a wide exposure range.

(b) When an optical system is constituted by a refracting lens (lenses) and a diffractive optical element (elements), while the diffractive optical element is effective as a freedom for correction of chromatic aberration, it does not directly concern the correction of field curvature. Thus, in order that both the field curvature and chromatic aberration are corrected at once in an optical system having a large numerical aperture and a wide exposure range, it inevitably needs use of an increased number of refracting lenses having a negative refractive power. This is an obstruction for simplification of the structure.

(c) When an optical system is constituted by a mirror (mirrors) and a refracting lens (lenses), while the mirror is effective as a freedom for correction of field curvature, it does not directly concern the correction of chromatic aberration. Thus, in order that both the field curvature and chromatic aberration are corrected at once in an optical system having a large numerical aperture and a wide exposure range, similarly, it needs use of an increased number of refracting lenses having positive and negative refractive power.

In consideration of the above, in this embodiment, the optical system is constituted by a refracting lens (lenses), a mirror (mirrors) and a diffractive optical element (elements). Since the diffractive optical element itself does not produce field curvature, what determines the field curvature is the mirror and the refracting lens.

Further, since the mirror does not contribute to correction of chromatic aberration, the refracting lens and the diffractive optical element function to correct the same.

Thus, use of the three elements of refracting lens, mirror and diffractive optical element, positively as described above, enables an optical system having a large numerical aperture and a wide exposure range, in which field curvature and chromatic aberration are corrected at once with a simple structure.

Further, in this embodiment, the final imaging optical system should desirably be provided by an element other than a mirror, as described hereinbefore, a refracting lens and a diffractive optical element are used to assure both a large numerical aperture and the correction of chromatic aberration and other aberrations. In the final imaging optical system, a positive refracting lens produces a large "under" chromatic aberration. Thus, with the provision of a diffractive optical element in the final imaging optical system, chromatic aberration otherwise to be produced by the final imaging optical system can be suppressed. As a result of this, the first imaging optical system G1 needs only a decreased number of optical components for cancelling chromatic aberration to be produced by the second imaging optical system. Thus, the structure can be made simple. Further, because of the provision of a mirror in the first imaging optical system, the Petzval sum correction in the whole optical system is easier, and the structure of the second imaging optical system can be made simple.

The second imaging optical system may include at least one diffractive optical element having a positive refractive power for correction of chromatic aberration. Through the diffractive optical element having inverse dispersion as compared with an ordinary refracting lens, chromatic aberration to be produced by the second imaging optical system can be reduced and, also, the chromatic aberration of the whole system can be corrected satisfactorily.

In order to cancel "under" field curvature (positive Petzval sum) produced by a refracting lens of the second imaging optical system, as having a positive refractive power, the first imaging optical system may include at least one mirror (concave mirror) having a positive refractive power.

Preferably, at least one diffractive optical element should satisfy the following condition:

$$3 < MP/\lambda < 50 \quad (9)$$

where MP is the minimum pitch (micron) of the diffractive optical element, and $\lambda$ is the exposure wavelength (micron).

Equation (9) above defines a condition related to the pitch of the diffractive optical element. If the upper limit thereof is exceeded, the pitch of the diffractive optical element becomes too large, and the effect thereof does not function well. Therefore, sufficient correction of chromatic aberration and simplicity in structure are not attainable. If the lower limit is exceeded, the pitch of the element becomes too small, to the contrary, such that the manufacture thereof becomes difficult.

Further, preferably, at least one of the diffractive optical elements used in the projection optical system should be disposed at a position which satisfies the following condition:

$$|Ld/LG2| < 0.2 \quad (10)$$

where Ld is the distance between an aperture stop of the second imaging optical system and the diffractive optical element, and LG2 is the distance from the paraxial image plane position of the first imaging optical system (corresponding to the axial object point position of the second imaging optical system G2) to the re-imaging plane where the intermediate image is re-imaged.

Equation (10) above defines the distance Ld between the diffractive optical element and the pupil (aperture stop). If the upper limit thereof is exceeded, the distance between the aperture stop and the diffractive optical element becomes too far, such that correction of chromatic aberration such as axial chromatic aberration becomes difficult to accomplish and, on the other hand, reducing the exposure non-uniformness upon the image plane becomes difficult.

More preferably, the following condition should be satisfied:

$$|Ld/LG2| < 0.15 \quad (10')$$

Further, in this embodiment, if the magnification of the second imaging optical system is $\beta G2$, the following condition should desirably be satisfied:

$$-0.5 < \beta G2 < -0.05 \quad (11)$$

Also, if the total axial optical distance is Lo and the distance between the first object 101 and the first mirror M1 is LM1, the following condition should preferably be satisfied:

$$0.1 < LM1/Lo < 0.5 \quad (12)$$

Figure 3:
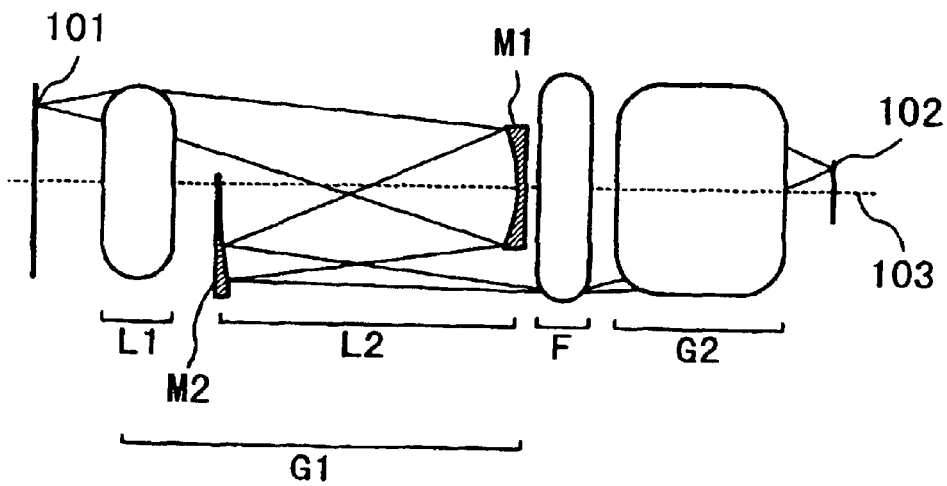
FIG. 3 is a schematic view for explaining a projection optical system in a first example of the present invention.

In FIG. 3, for example, Lo corresponds to the following distance:

*Lo*=(distance from object surface 101 to first mirror *M*1)+(distance from first mirror *M*1 to second mirror *M*2)+(distance from second mirror *M*2 to image plane 102).

Equation (11) above determines an appropriate value for the effective diameter of the second imaging optical system and, also, it defines the magnification of the second imaging optical system G2 to assure a predetermined magnification throughout the optical system as a whole or simplifies the structure of the first imaging optical system G1. If the lower limit of the same is exceeded, the effective diameter of the second imaging optical system G2 increases excessively and, additionally, the height of the intermediate image (object height in the second imaging optical system G2) becomes small. As a result, it becomes difficult to direct light from the first imaging optical system G1 to the second imaging optical system G2. If the upper limit is exceeded, the refractive power of the second imaging optical system G2 becomes large, so that the aberration correction becomes difficult to accomplish. Also, the height of the intermediate image (object height in the second imaging optical system G2) increases excessively. This is undesirable.

Equation (12) above defines the position M1 the respect to the total axial optical length of the optical system. If the lower limit is exceeded, the refractive power of the first imaging optical system increases, and aberration correction becomes difficult. If the upper limit is exceeded, the effective diameter of the first mirror M1 increases excessively, such that the refractive power of the second imaging optical system G2 increases. As a result, well-balanced aberration correction in the whole system cannot be attained.

A field stop may be provided adjacent to an intermediate image formed by the first imaging optical system G1, by which the exposure range can be restricted.

This embodiment is particularly effective for structuring a projection optical system having a large numerical aperture and a wide exposure range and to be used with a light source of a short wavelength (exposure wavelength) of 200 nm or shorter, since, in the short wavelength region, such as that of an ArF excimer laser or an $F_2$ excimer laser, usable glass materials are limited such that correction of chromatic aberration is difficult to accomplish only with the use of ordinary refracting lenses.

As regards lenses and diffractive optical elements, for the short wavelength region of 200 nm or shorter as that of ArF or $F_2$, a material having a high light transmissivity such as composite quartz (or fluorine doped quartz) or fluorite, for example, may be used. Further, these optical elements may desirably be disposed in an ambience of inactive gas such as $N_2$ or He.

Several specific examples of the present invention will be described below. In each of these examples, the optical system is structured as a projection optical system to be used in a projection exposure apparatus of a step-and-repeat type or step-and-scan type. In ordinary lithographic processes, a wafer is exposed to a device pattern by use of this exposure apparatus, and a development process and an etching process are then made to the exposed wafer.

EXAMPLE 1

FIG. 3 shows the lens structure according to Example 1 of the present invention. In this example, the optical system includes at least one mirror, at least one lens and at least one diffractive optical element. Those optical elements having a focal length in the optical system are all designed to have a positive refractive power. Denoted at 103 is an optical axis of this optical system. The optical system comprises a double-imaging optical system which includes at least a first imaging optical system G1 for forming an intermediate image of the first object 101 and a second imaging optical system G2 for imaging the intermediate image upon the second object 102. The first imaging optical system G1 comprises at least one mirror and at least one refracting lens, while the second imaging optical system G2 comprises at least one refracting lens and at least one diffractive optical element.

More specifically, the optical system includes, in an order from the object side, a refracting lens group L1 having a positive refractive power, a group L2 having a mirror (mirrors), a field lens group F, and a second imaging optical system G2. A refracting lens (lenses) constituting the refracting lens group L1 has a positive refractive power. The group L2 comprises a first mirror (concave mirror) M1 and a second mirror (concave mirror) M2. Since both of them are concave mirrors, the group L2 has a positive refractive power. Also, a refracting lens (lenses) constituting the field lens group F and a refracting lens (lenses) constituting the second imaging optical system G2 similarly have a positive refractive power.

In the structure of this example, the light from the first mirror M1 and reflected by the second mirror M2 passes outside the effective diameter of the first mirror M1. Also, the optical system of this example has only one optical system. With this arrangement, a projection optical system in which the central portion of a pupil is not void (light blocked) is accomplished.

Figure 14:
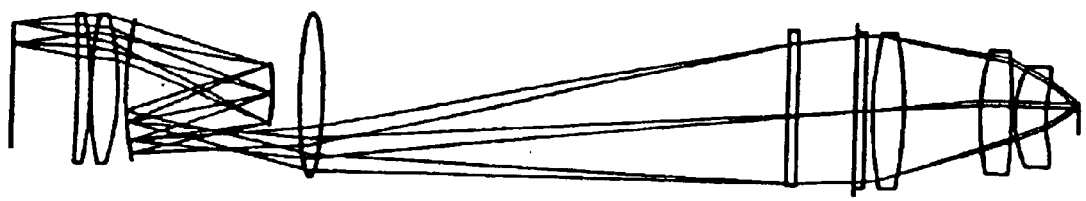
FIG. 14 is a sectional view of a lens structure in the first example of the present invention.

FIG. 14 is a sectional view of the lens structure of a projection optical system, according to this example of the present invention. The projection optical system had a projection magnification of 1:4, and the reference wavelength (design wavelength) thereof was 157 nm. The glass material used was fluorite.

In this example, the image side numerical aperture was NA=0.6, and the reduction magnification was 1:4. The object-to-image distance (from the surface of the first object to the surface of the second object) was L—about 1160 mm. Aberrations were corrected with respect to the reference wavelength of 157 nm, and within an image height range of about 11.25–16.25 mm. Upon an image plane, an arcuate exposure region of a size of at least about 26 mm in the lengthwise direction and about 4 mm in the widthwise direction, was assured.

Figure 9:
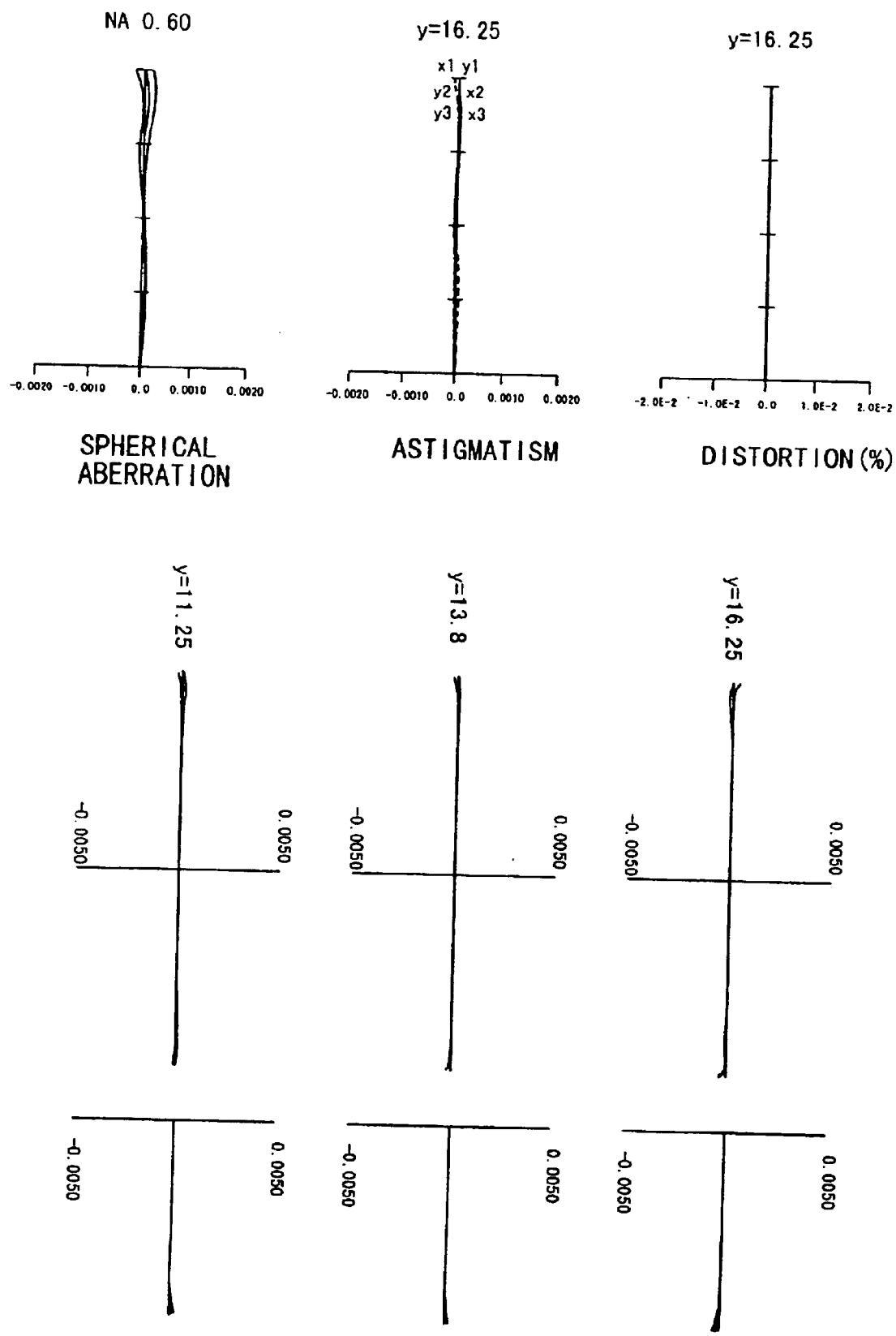
FIG. 9 shows aberrations of a projection optical system in the first example of the present invention.

FIG. 9 shows longitudinal and lateral aberrations in this example. The aberrations are illustrated with respect to the reference wavelength and a wavelength of ±2 pm.

The structure of the optical system of this example will be described more specifically.

The refracting lens group L1 comprises, in an order from the object side, an aspherical positive lens of approximately flat-convex shape having a convex surface facing to the image side, and an aspherical positive lens of biconvex shape. This lens group mainly contributes to correction of telecentricity or distortion aberration, for example.

The group L2, including two mirrors, comprises, in an order form passage of light from the refracting lens group L1, an aspherical mirror having a concave surface facing the object side, and an aspherical mirror having a concave surface facing the image side. These mirrors function to produce a field curvature in the "over" direction, by which an image field curvature to be produced in the second imaging optical system G2 in the "under" direction can be cancelled.

Further, the groups L1 and L2 cooperate to form an intermediate image at a position adjacent to the first mirror M1.

The field lens group F disposed about the intermediate image of the first object 101 formed by the first imaging optical system G1 comprises an aspherical positive lens of biconvex shape. It serves to direct the light from the first imaging optical system G1 to the second imaging optical system G2, and also to mainly correct distortion aberration.

The second imaging optical system G2 comprises, in an order from the object side, a diffractive optical element having a positive refractive power, an aperture stop, a diffractive optical element having a positive refractive power, two aspherical positive lenses of biconvex shape, and an aspherical lens having a convex shape facing the object side.

Both of the two diffractive optical elements have a minimum pitch of about 2 microns. Namely, when binary optics are used to approximate this diffractive optical element by a step-like shape and if an eight-level stepped structure is to be provided, the width of each step is about 0.25 micron. This can be well produced by using a semiconductor exposure apparatus having a light source of KrF, for example. These diffractive optical elements are used to mainly correct a large "under" axial chromatic aberration to be produced by the second imaging optical system G2, and also to correct the balance of chromatic aberration of the total system magnification. Further, through the aspherical surface effect, they contribute mainly to the correction of spherical aberration and coma.

The field lens group F may be included in one or or both of the first and second imaging optical systems G1 and G2 (i.e., an intermediate image is formed inside the field lens group F). For the very reason, here, it is illustrated as a group separate from the first and second imaging optical systems G1 and G2. However, it may belong to any one of the imaging optical systems, within the scope of the present invention.

From the above-described example, it is seen that, with the structure of an optical system according to the present invention, an optical system having a reduced number of elements and assuring well corrected aberrations can be accomplished.

In this example, the conical constant k is taken as zero. However, the design may be made while taking the conical constant as a variable. Further, in this example, only fluorite was used as a glass material for a wavelength of 157 nm. If any other glass material such as fluorine doped quartz, for example, is available, it may be used. When the light source comprises a KrF excimer laser of an ArF excimer laser, fluorite and quartz may be used in combination. Of course, one of them may be used.

While, in this example, an $F_2$ excimer laser having an emission wavelength of 157 nm was used as an exposure light source, a KrF excimer laser or an ArF excimer laser may be used. The invention is particularly effective when it is applied to an optical system in a case wherein the wavelength is shorter and usable optical materials are limited, and wherein the transmission factor becomes low so that the number of structural elements of the optical system should be reduced. Therefore, the invention is very effective in an optical system to be used with a wavelength not greater than 250 nm.

In this example, an aspherical lens which has a spherical surface formed on a side opposite to the aspherical surface thereof is used. However, the face opposite to the aspherical surface may be a flat surface or an aspherical surface. Further, although all the refracting lenses used in this example are aspherical lenses, aspherical lenses and spherical lenses may be used in combination.

The first and second mirrors M1 and M2 have aspherical surfaces. However, they may be formed with spherical surfaces. Use of aspherical surfaces is, however, preferable, in order that the optical system is provided by a smaller number of elements and it has a high resolving power. The second mirror M2 may be a flat mirror. Also, the flat mirror may be formed with an aspherical surface. It is desirable that at least one aspherical lens or aspherical mirror is used in the optical system. Use of an aspherical surface effectively assures better correction of aberrations and reduction of the number of elements used.

While this example uses two diffractive optical elements, the present invention is not limited to this. Only one element may be used or, alternatively, many diffractive optical elements may be used.

When a diffractive optical element is produced on the basis of binary optics, the number of steps (levels) approximating a Kinoform may be other than eight.

Further, although the exposure region has an arcuate shape in this example, a rectangular shape or any other shape may be used, as long as it is defined within an exposure region where aberrations are corrected.

Table 1 below concerns Example 1 described above.

TABLE 1

| |Ld/LG2| | βG2 | LM1/Lo |
|---|---|---|
| D1 = 0.066 D2 = 0.001 | −0.27 | 0.19 |

EXAMPLE 2

Figure 4:
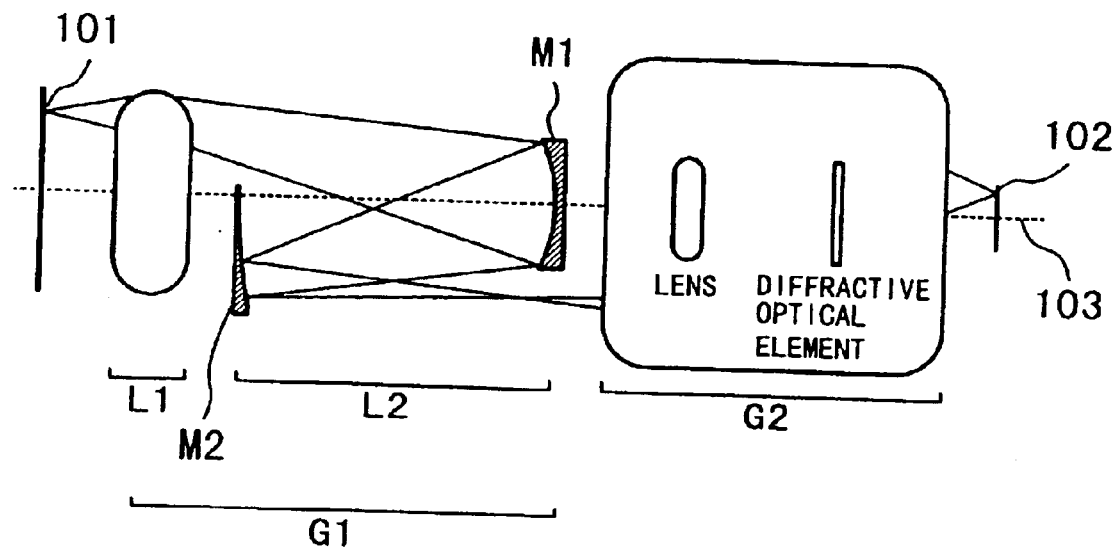
FIG. 4 is a schematic view for explaining a projection optical system in a second example of the present invention.

FIG. 4 is a schematic view of a projection optical system according to Example 2 of the present invention. The first imaging optical system G1 comprises, in an order from the object side, at least a group L1 having a refracting lens, and a group L2 having two mirrors disposed opposed to each other. The group L2 is provided by a first mirror M1 and a second mirror M2. Light from the first object 101 is imaged by the first imaging optical system G1, whereby an intermediate image is formed. Here, the structure is arranged so that abaxial light from the first object 101 passes outside the effective diameter of the first mirror M1. The intermediate image as formed by the first imaging optical system G1 is imaged by the second imaging optical system G2, constituted by a refracting lens and a diffractive optical element, upon the second object 102 at a predetermined magnification. The object surface 101 and the image plane 102 are disposed at the opposite ends of the optical system.

With the structure described above, the optical system of this example has a single optical axis 103, and it assures the imaging of abaxial light without any light interception at the pupil. This can be accomplished by a reduced number of optical elements.

Figure 15:
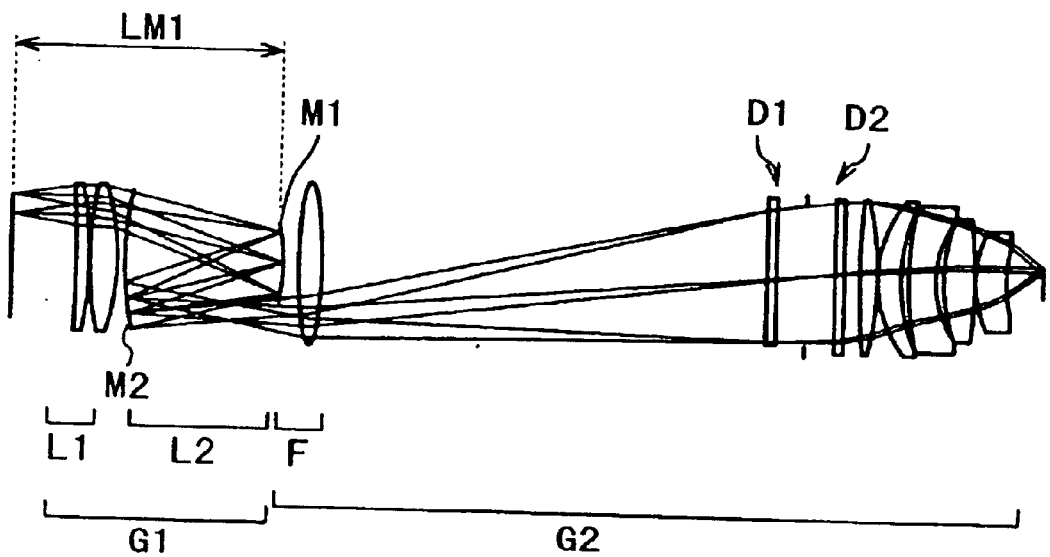
FIG. 15 is a sectional view of a lens structure in the second example of the present invention.

FIG. 15 shows a specific lens structure according to this example. Denoted in the drawing at D1 and D2 are diffractive optical elements.

In the projection optical system of this example, the image side numerical aperture was NA=0.6, and the reduction magnification was 1:4. The object-to-image distance (from the surface of the first object to the surface of the second object) was L=about 1160 mm. Aberrations were corrected with respect to the reference wavelength of 157 nm, and within an image height range of about 11.25–16.25 mm. An arcuate exposure region of a size of at least about 26 mm in the lengthwise direction and about 5 mm in the widthwise direction, was assured.

Figure 10:
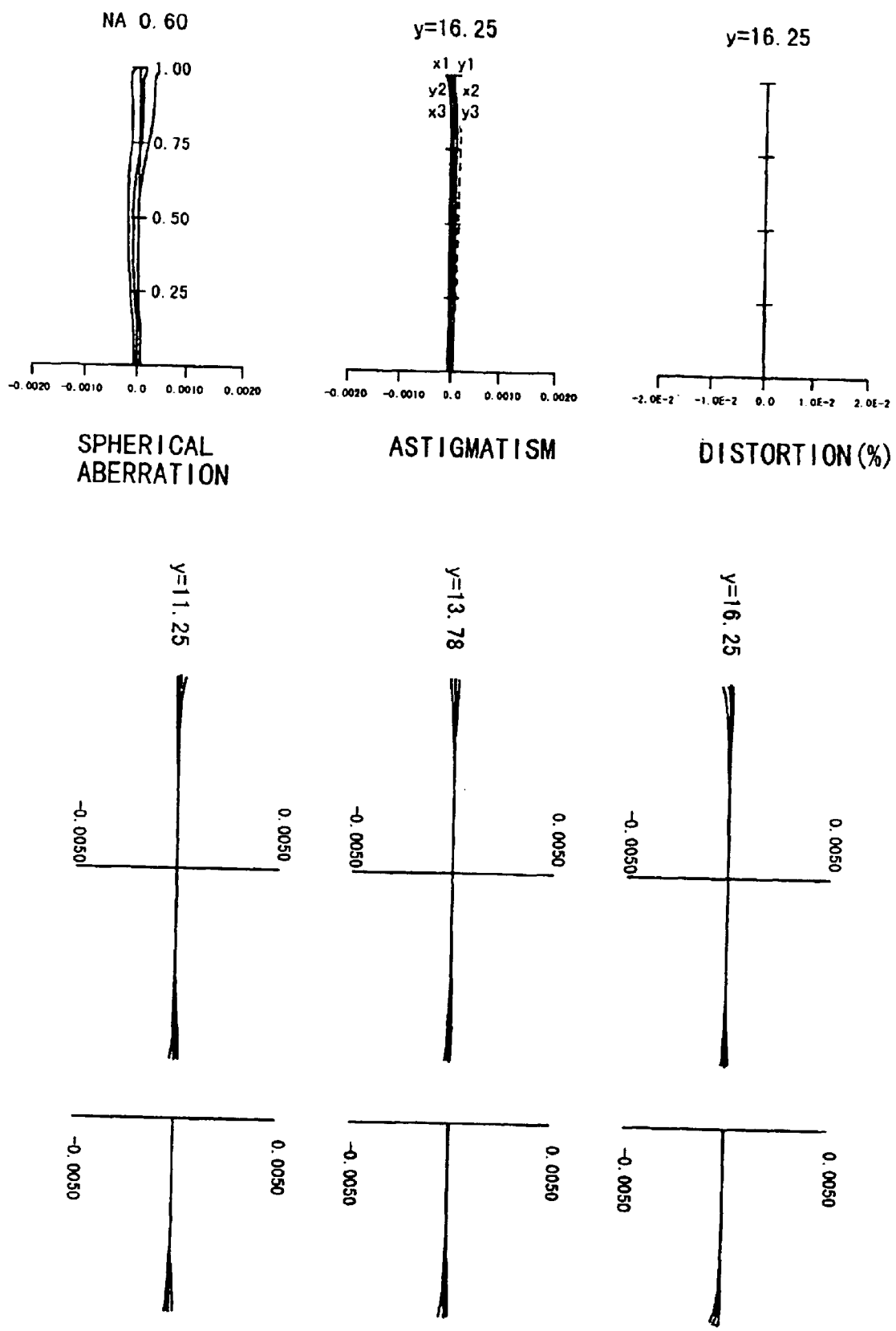
FIG. 10 shows aberrations of a projection optical system in the second example of the present invention.

FIG. 10 shows longitudinal and lateral aberrations in this example. The aberrations are illustrated with respect to the reference wavelength and a wavelength of ±1 pm.

The refracting lens group L1 comprises, in an order from the object side, an aspherical positive lens of meniscus shape having a concave surface facing the object side, and an aspherical positive lens of approximately flat-convex shape having a convex surface facing the image plane side. This lens group L1 mainly serves to keep a well corrected balance of the distortion and the telecentricity, and also to direct an abaxial light flux from the first object to the first mirror M1. The first mirror M1 is a concave mirror having a concave surface facing the object side, and it has a positive refractive power. It functions to produce a field curvature in the positive direction, to cancel a negative field curvature to be produced by the second imaging optical system. The second mirror M2 is a concave mirror having a concave surface facing to the image side. It operates to direct the abaxial light flux from the first object 101 to the outside of the first mirror M1. The intermediate image being imaged by the first imaging optical system is formed adjacent to the outside of the effective diameter of the first mirror M1 (in this example, the light reflected by the second mirror M2 in a direction toward the second imaging optical system G2 is defined at a portion closer to the mirror M2 from the outside of the effective diameter of the first mirror M1).

With the structure of this example as described above, the reflection light from the first mirror M1 and the reflection light from the second mirror M2 can be separated from each other very easily.

In this example, a single aspherical lens of biconvex shape is disposed as the field lens group F, at a position adjacent to the intermediate image.

As shown in FIG. 15, the provisions of a field lens group F adjacent to the intermediate image is very effective to separate the light from the second mirror M2 with respect to the first mirror M1 and a refracting lens group R, without excessively increasing the mirror refractive power in the group L2 including two mirrors. Preferably, this field lens group F may have a positive refractive power, so that it may function to refract the light from the first imaging optical system G1 toward the second imaging optical system G2 to thereby avoid enlargement in size of the effective diameter of the second imaging optical system G2. Thus, it assures a smaller effective diameter of the second imaging optical system. Further, since it is disposed adjacent to the intermediate image, it functions well for correction of abaxial aberration such as distortion aberration, for example.

The field lens group F may be included in one or or both of the first and second imaging optical systems G1 and G2 (i.e., an intermediate image is formed inside the field lens group F). It may belong to any one of the imaging optical systems, within the scope of the present invention.

The second imaging optical system G2 comprises, in an order from the object side, a diffractive optical element having a positive refractive power, an aperture stop, a diffractive optical element having a positive refractive power, an aspherical positive lens having a biconvex shape, a positive lens of meniscus shape having a convex surface facing to the object side, a negative lens of meniscus shape having a concave surface facing to the image side, and an aspherical positive lens of meniscus shape having a convex surface facing to the object side. The second imaging optical system G2 provides a reduction system for imaging the light from the field lens F onto the surface of the second object 102.

Each of the two diffractive optical elements has a minimum pitch of about 2.5 microns. Thus, when binary optics are used to produce this diffractive optical element and if an eight-level structure per pitch is to be formed, the smallest linewidth required for the smallest pitch of this diffractive optical element is about 0.31 micron.

With the arrangement described above, a good catadioptric system in which the structure is very simple and in which color correction and correction of any other aberrations are well made, is accomplished.

While this example uses only one lens for the field lens group F, plural lenses may be used therefor. Also, the field lens group F may be omitted.

Table 2 below shows numerical values corresponding to equations (10)–(12).

TABLE 2

| |Ld/LG2| | βG2 | LM1/Lo |
|---|---|---|
| D1 = 0.036  D2 = 0.037 | −0.26 | 0.23 |

EXAMPLE 3

Figure 5:
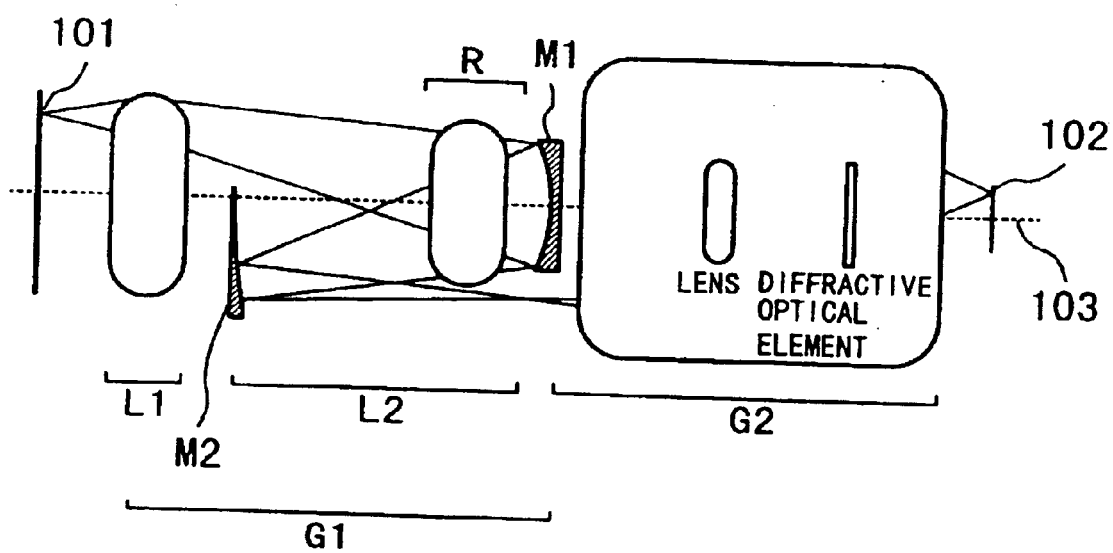
FIG. 5 is a schematic view for explaining a projection optical system in a third example of the present invention.

FIG. 5 is a schematic view of a projection optical system according to Example 3 of the present invention. The first imaging optical system G1 comprises, in an order from the object side, at least a group L1 having a refracting lens, and a group L2 including at least two mirrors. The group L2 comprises a first mirror M1, a second mirror M2 and a refracting lens group R. This refracting lens group R functions to transmit therethrough both the incident light from the first object 101 and the reflection light from the first mirror M1. Namely, it defines a reciprocal optical system. Light from the first object 101 is directed to the second mirror M2, by which the light is reflected toward the image plane, and thereafter, an intermediate image is formed. Here, the structure is arranged so that abaxial light flux from the first object 101 passes outside the effective diameter of the first mirror M1. The intermediate image as formed by the first imaging optical system G1 is imaged by way of the field lens group F and by the second imaging optical system G2, constituted by a refracting lens and a diffractive optical element, upon the second object 102 at a predetermined magnification.

Figure 16:
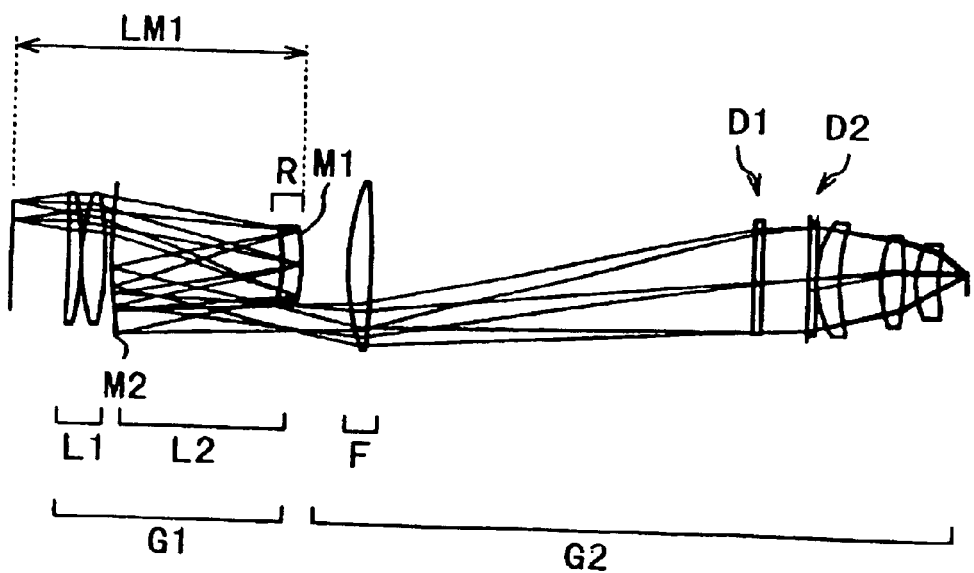
FIG. 16 is a sectional view of a lens structure in the third example of the present invention.

FIG. 16 shows a specific lens structure according to Example 3.

In the projection optical system of this example, the image side numerical aperture was NA=0.6, and the reduction magnification was 1:4. The object-to-image distance (from the surface of the first object to the surface of the second object) was L=about 1195 mm. Aberrations were corrected with respect to the reference wavelength of 157 nm, and within an image height range of about 11.25–16.75 mm. An arcuate exposure region of a size of at least about 26 mm in the lengthwise direction and about 5 mm in the widthwise direction, was assured.

Figure 11:
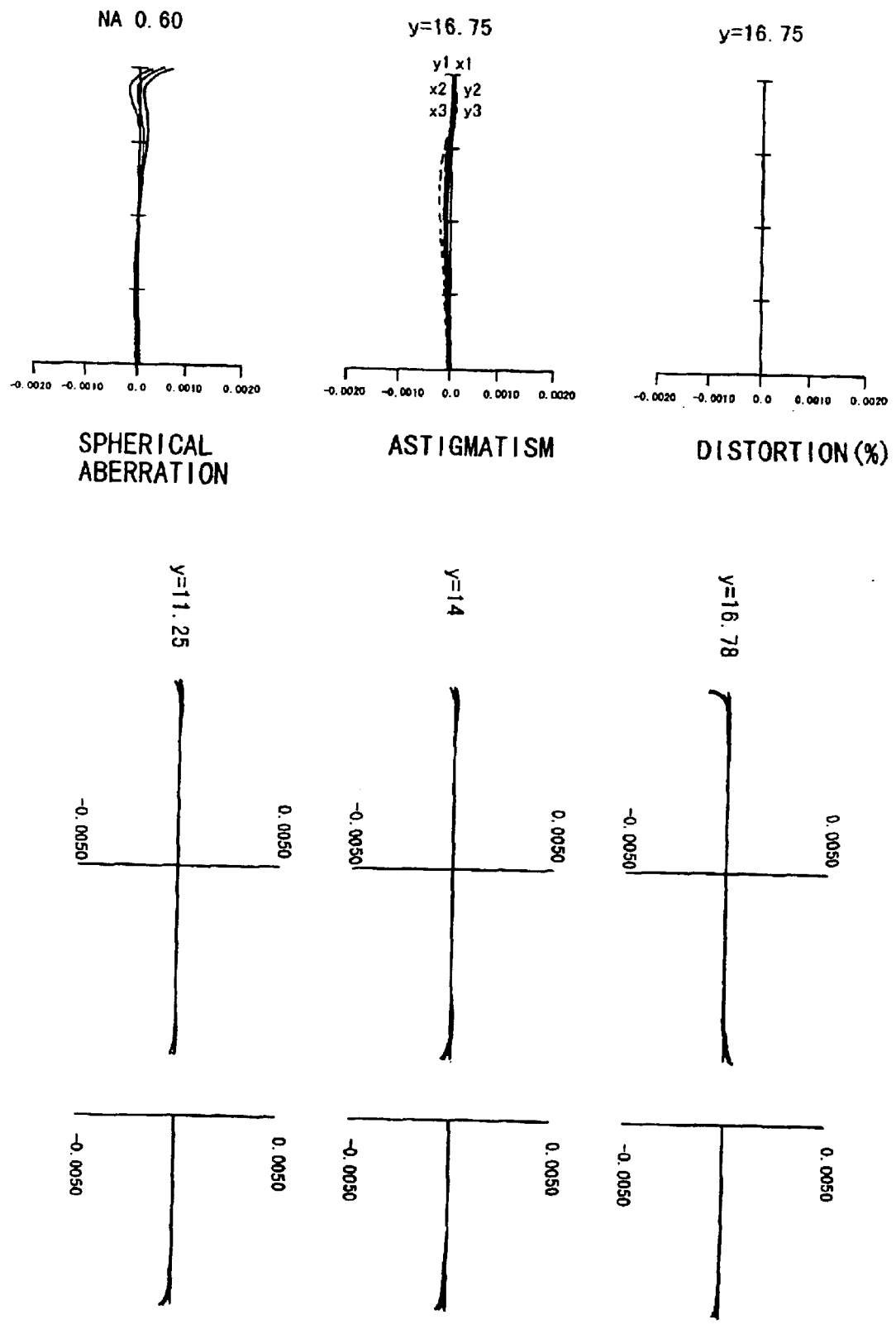
FIG. 11 shows aberrations of a projection optical system in the third example of the present invention.

FIG. 11 shows longitudinal and lateral aberrations in this example. The aberrations are illustrated with respect to the reference wavelength and a wavelength of ±2pm.

The refracting lens group L1 comprises, in an order from the object side, an aspherical positive lens of meniscus shape having a concave surface facing to the object side, and an aspherical positive lens of biconvex shape. This lens group L1 mainly serves to keep well corrected balance of the distortion and the telecentricity, and also to direct the light toward the reciprocal optical system R and the first mirror M1.

The refracting lens group R which is a reciprocal optical system comprises an aspherical negative lens of meniscus shape, having a concave surface facing the object side. With this negative lens, mainly the field curvature and axial chromatic aberration to be produced by the second imaging optical system G2 are corrected with a good balance and, additionally, spherical aberration and coma, for example, are also corrected.

The first mirror M1 is a concave mirror having a concave surface facing to the object side, and it has a positive refractive power. It functions to produce a field curvature in the positive direction, to cancel a negative field curvature to be produced by the positive refracting lens of the second imaging optical system. The second mirror M2 is a concave mirror having a concave surface facing the image side. It operates to direct the abaxial light flux from the first object 101 to the outside of the first mirror M1. The intermediate image is formed adjacent to the outside of the effective diameter of the first mirror M1. Further, a single aspherical lens of biconvex shape is disposed as the field lens group F, at a position adjacent to the intermediate image.

The second imaging optical system G2 comprises, in an order from the object side, a diffractive optical element having a positive refractive power, an aperture stop, a diffractive optical element having a positive refractive power, an aspherical positive lens of meniscus shape having a concave surface facing to the image side, an aspherical positive lens of biconvex shape, and an aspherical lens having a convex surface facing to the object side. The second imaging optical system G2 provides a reduction system for imaging the light from the field lens F onto the surface of the second object 102.

Each of the two diffractive optical elements has a minimum pitch of about 2.0 microns. Thus, when binary optics are used to produce this diffractive optical element and if an eight-level structure per pitch is to be formed, the smallest linewidth required for the smallest pitch of this diffractive optical element is about 0.25 micron.

With the arrangement described above, a good catadioptric system in which the structure is very simple and in which color correction and correction of any other aberrations are well made, is accomplished.

Figure 6A:
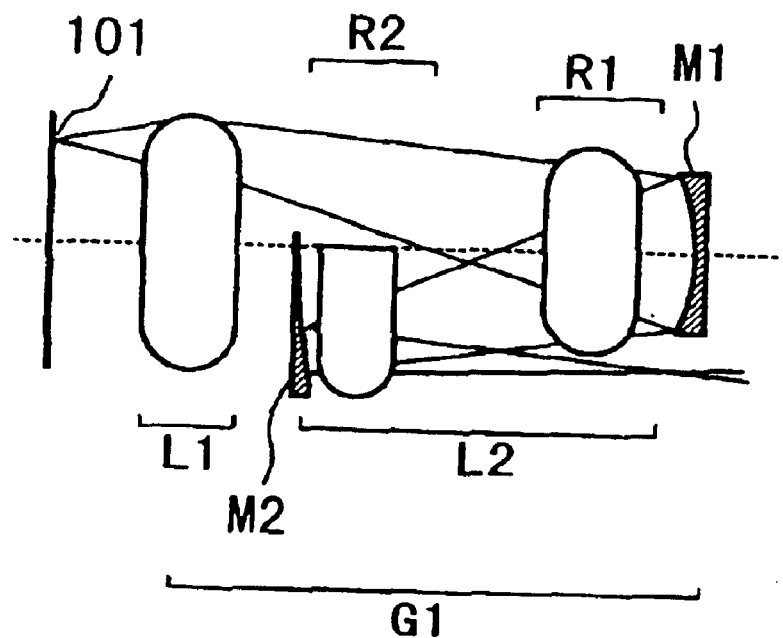
FIGS. 6A, 6B, 6C and 6D are schematic views, respectively, for explaining a projection optical system in the third example of the present invention.
Figures 6B, 6C, 6D:
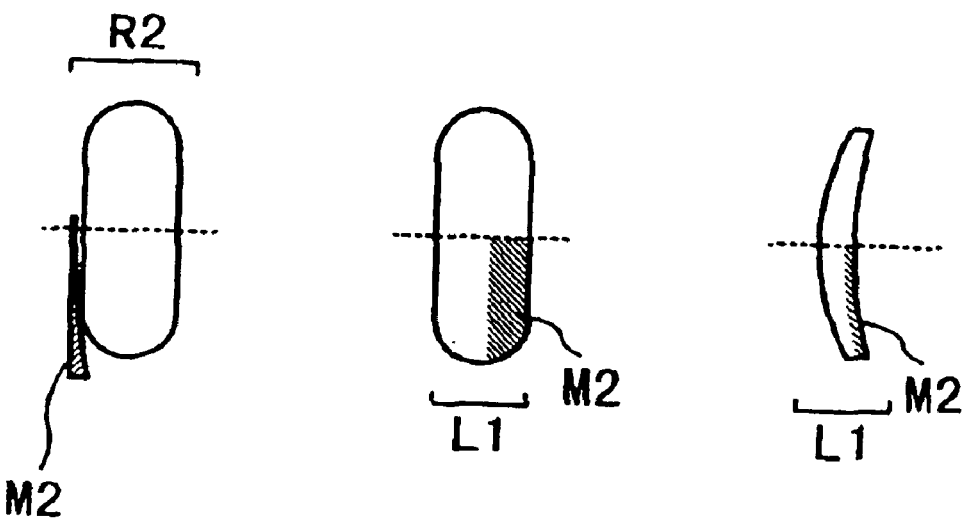

Although in this example the refracting lens group R is disposed adjacent to the first mirror M1, it may be disposed adjacent to the second mirror M2. Namely, as shown in FIG. 6A, the lens group may be disposed at the position for passing the reflection light from the first mirror M1 and the reflection light from the second mirror M2. FIGS. 6B, 6C and 6D show modified examples. In FIG. 6B, it is disposed at a position for passing the light from the refracting lens group L1, the reflection light from the first mirror M1 and the reflection light from the second mirror. In FIGS. 6C and 6D, a portion of the refracting lens is formed with a reflection mirror. In these cases, the refracting lens group L1 and the second mirror M2 may be provided by one refracting lens.

As regards the refracting lens group R, it may be disposed anywhere within the range of the group L2 having two mirrors, and also it may be comprise lenses of a desired number. However, from the standpoint of simple structure, the number of refracting lenses provided in the group L2 should desirably be reduced as much as possible. The second mirror M2 may be a concave mirror, a flat mirror, or a convex mirror. However, in order that the refractive power of the first mirror is shared, preferably a concave mirror is used.

Table 3 below shows numerical values corresponding to equations (10)–(12).

TABLE 3

| |Ld/LG2| | βG2 | LM1/Lo |
|---|---|---|
| D1 = 0.067 D2 = 0.001 | −0.23 | 0.25 |

EXAMPLE 4

Figure 7:
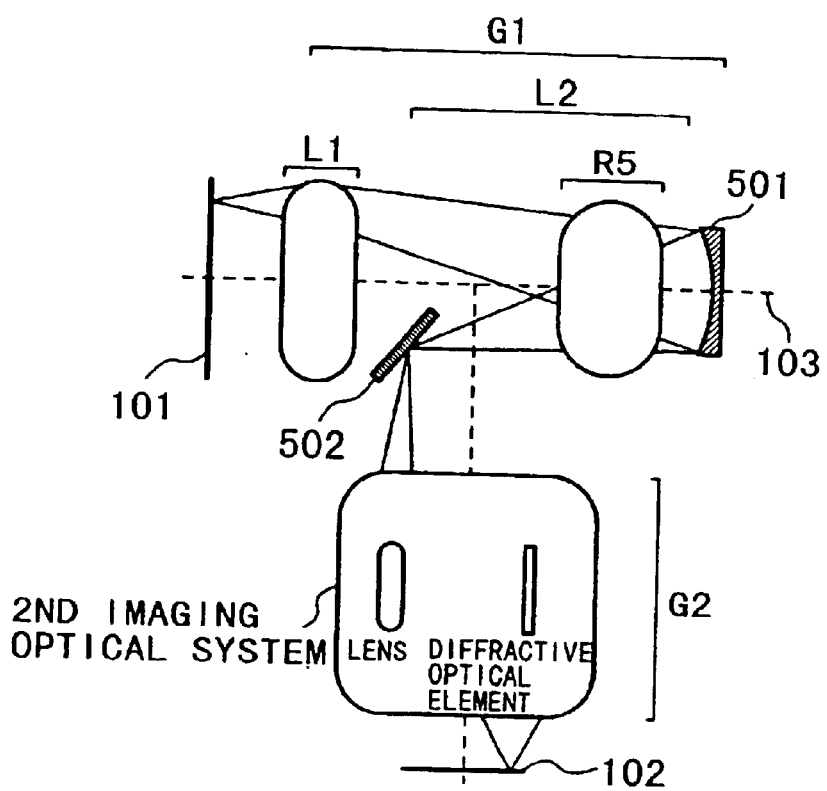
FIG. 7 is a schematic view for explaining a projection optical system in a fourth example of the present invention.

FIG. 7 is a schematic view of a projection optical system according to Example 4 of the present invention. The first imaging optical system G1 comprises, in an order from the object side, at least a group L1 having a refracting lens, and a group L2 having at least one concave mirror 501. Light from the first object 101 is imaged by the first imaging optical system G1, whereby an intermediate image is formed. Here, there is a reflection surface 502 disposed adjacent to the intermediate image formed by the first imaging optical system G1, for deflecting the light, by which the abaxial light flux from the first object 101 and the light from the concave mirror 501 are separated from each other. The light is then directed to a second imaging optical system G2 which is constituted by a refracting lens and a diffractive optical element.

Figure 17:
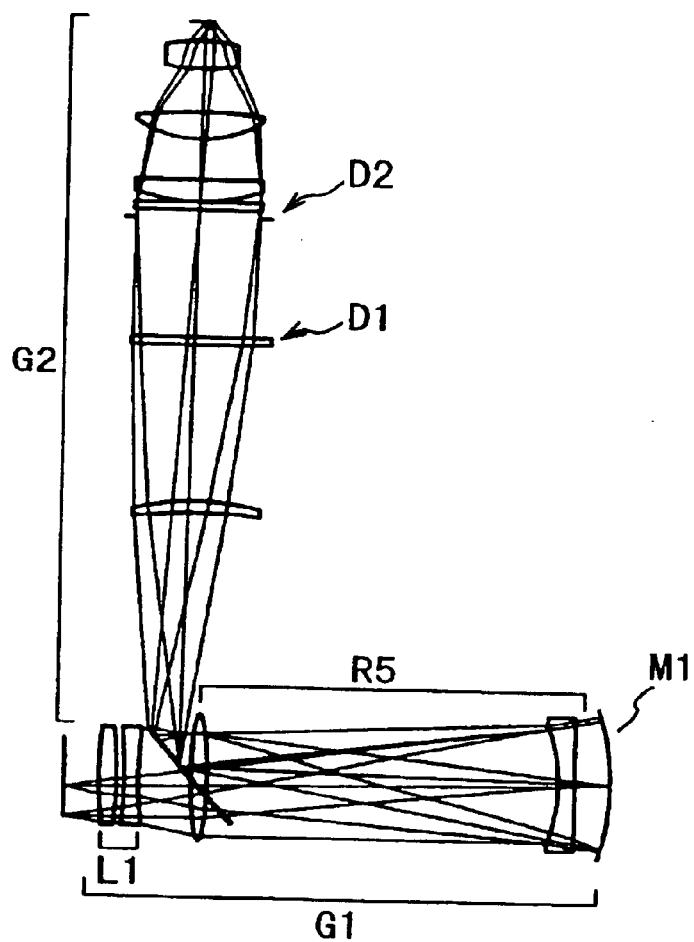
FIG. 17 is a sectional view of a lens structure in the fourth example of the present invention.

FIG. 17 shows a specific lens structure according to Example 4.

In the projection optical system of this example, the image side numerical aperture was NA=0.6, and the reduction magnification was 1:4. Aberrations were corrected with respect to the reference wavelength of 157 nm, and within an image height range of about 11.25–16.25 mm. As regards the image height, a ring field region of 5 mm to 18.6 mm was assured.

Figure 12:
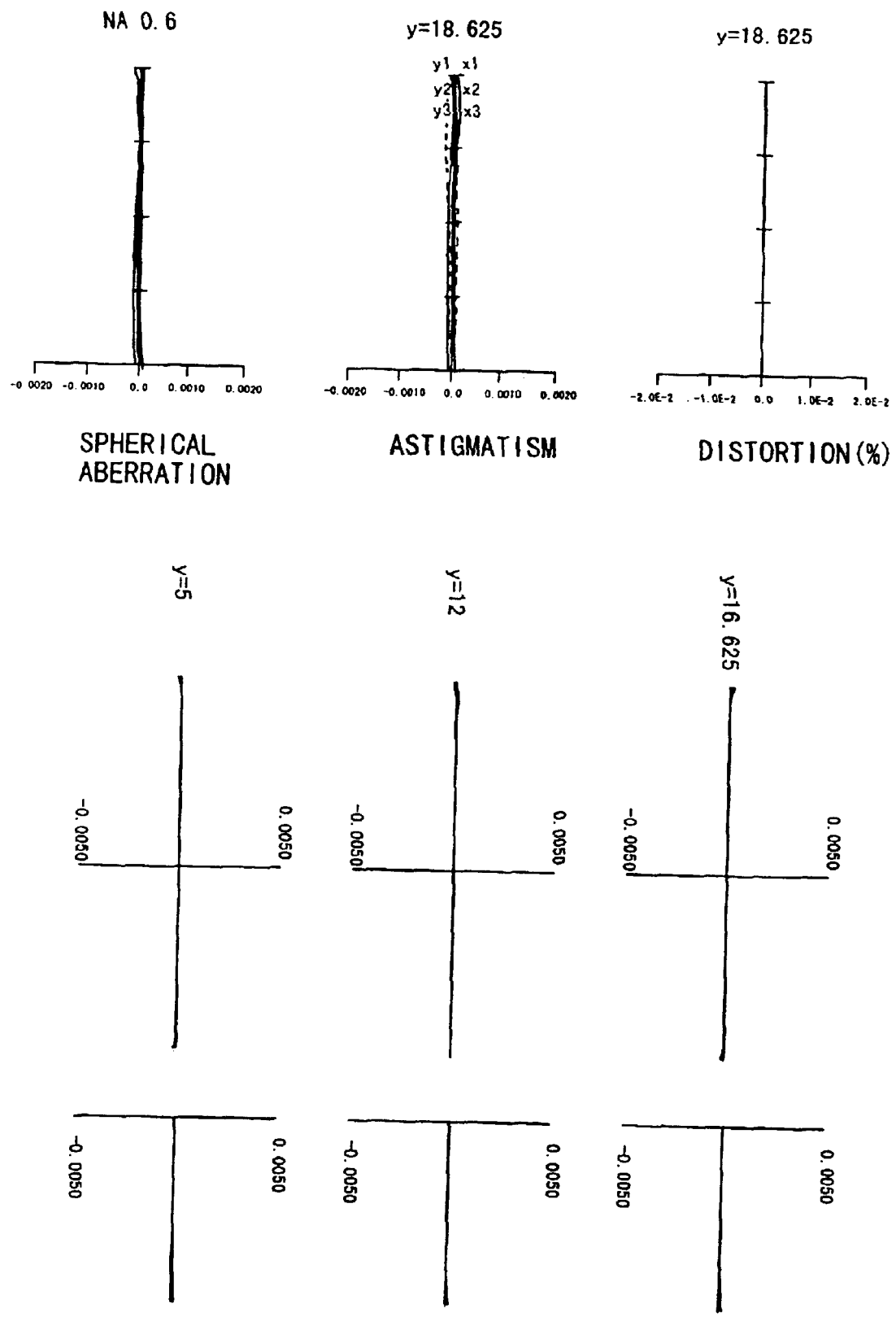
FIG. 12 shows aberrations of a projection optical system in the fourth example of the present invention.

FIG. 12 shows longitudinal and lateral aberrations in this example. The aberrations are illustrated with respect to the reference wavelength and a wavelength of ±20 pm.

The refracting lens group L1 includes two refracting lenses. More specifically, it comprises, in an order from the object side, an aspherical positive lens of biconvex shape and an aspherical positive lens of biconcave shape.

The group L2 including one concave mirror comprises, in an order from the object side, an aspherical positive lens of biconvex shape, an aspherical negative lens having a concave surface facing to the object side, and a concave mirror. The aspherical positive lens of biconvex shape and the aspherical negative lens with a concave surface facing to the object side cooperate to provide a reciprocal optical system R which transmits therethrough the light from the group L1 and the light reflected by the concave mirror.

Denoted in FIG. 7 at 502 is a reflection surface which, in this example, serves to deflect the optical axis 503 by 90 degrees. The intermediate image of the first imaging optical system G1 is formed adjacent to the reflection surface 502.

The second imaging optical system G2 comprises, in an order from the object side, an aspherical positive lens having a convex surface facing to the image plane, a diffractive optical element having a positive refractive power, an aperture stop, a diffractive optical element having a positive refractive power, an aspherical positive lens having an approximately flat-convex shape, having a convex surface facing to the intermediate image, and two aspherical positive lenses of biconvex shape.

The diffractive optical elements have minimum pitches of about 2.25 microns and 2.20 microns, in the order being far away from the image plane. Thus, when binary optics are used to produce this diffractive optical element and if an eight-level structure per pitch is to be formed, the smallest linewidths required for the smallest pitch of this diffractive optical element are about 0.28 micron and 0.27 micron, respectively.

Figure 8:
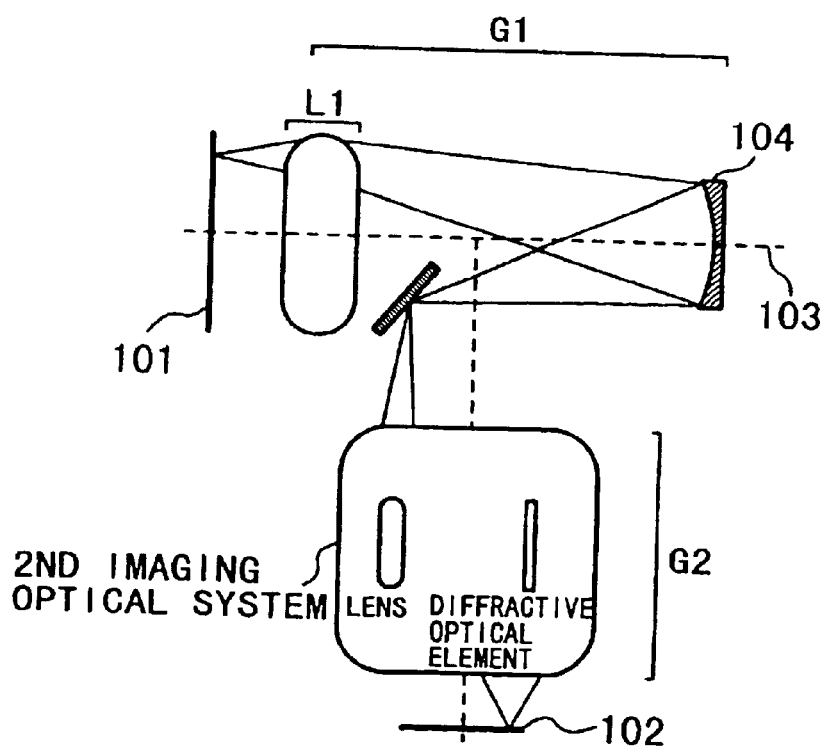
FIG. 8 is a schematic view for explaining a projection optical system in the fourth example of the present invention.

Although in this embodiment a reciprocal optical system R5 is disposed inside the group L2, it may be omitted as shown in FIG. 8. Further, a flat mirror may be disposed in the second imaging optical system, and, on that occasion, the object plane 101 and the image plane 102 may be disposed parallel to each other.

Table 4 below shows numerical values corresponding to equations (10)–(12).

TABLE 4

| |Ld/LG2| | βG2 | LM1/Lo |
|---|---|---|
| D1 = 0.068 D2 = 0.005 | −0.25 | 0.32 |

EXAMPLE 5

This example is similar to Example 1, and the optical system includes at least one mirror, at least one lens and at least one diffractive optical element. Those optical elements in the optical system, as having a focal length, all have a positive refractive power. A major difference of this example from Example 1 is the difference in magnification of the optical system.

Figure 18:
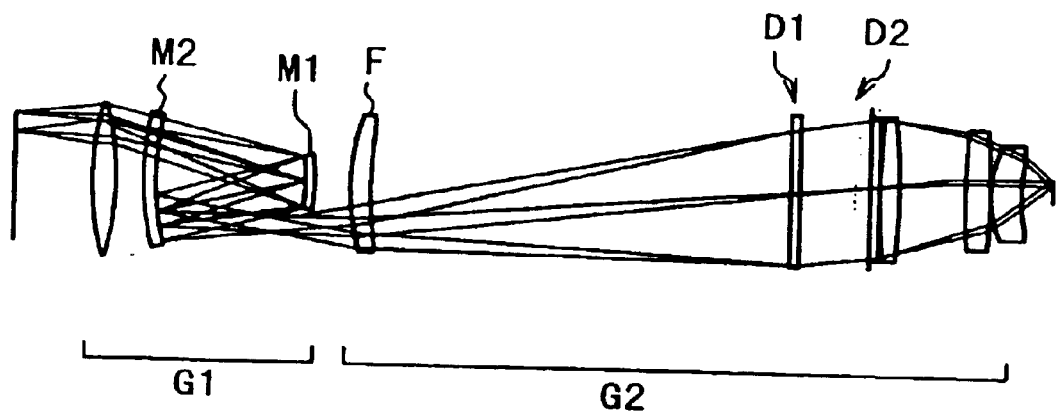
FIG. 18 is a sectional view of a lens structure in the fifth example of the present invention.

FIG. 18 shows a specific lens structure according to this example. Denoted in the drawing at D1 and D2 are diffractive optical elements.

In the projection optical system of this example, the image side numerical aperture was NA=0.6, and the reduction magnification was 1:6. The object-to-image distance (from the surface of the first object to the surface of the second object) was L=about 1180 mm. Aberrations were corrected with respect to the reference wavelength of 157 nm, and within an image height range of about 7.5–10.83 mm.

Figure 13:
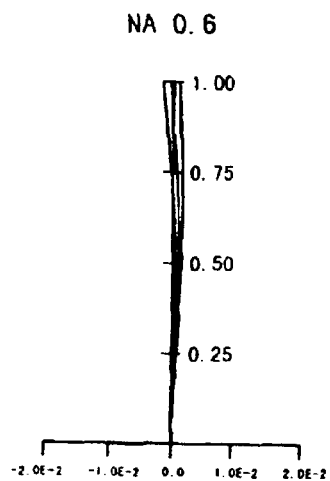
FIG. 13 shows aberrations of a projection optical system in a fifth example of the present invention.
Figure 13:
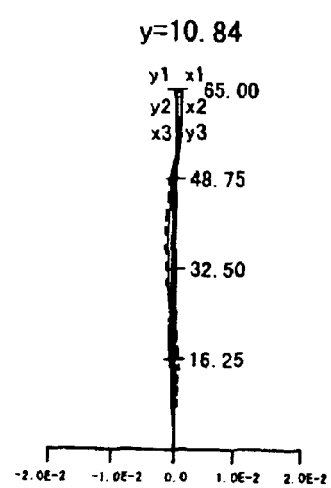
Figure 13:
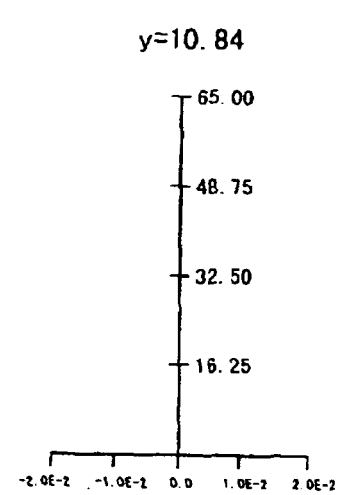
Figure 13:
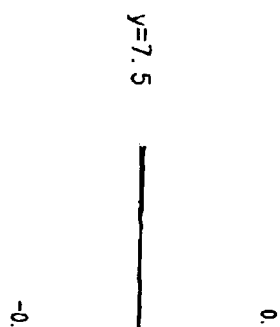
Figure 13:
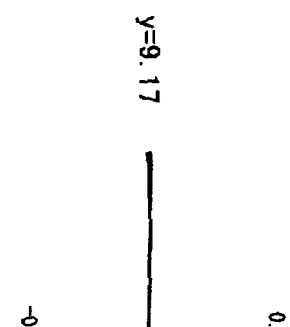
Figure 13:
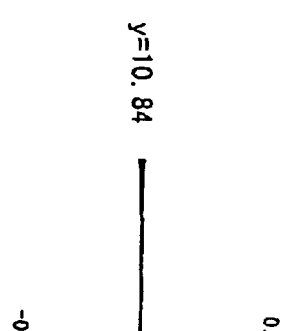
Figure 13:
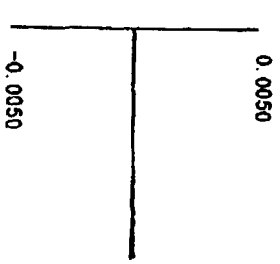
Figure 13:
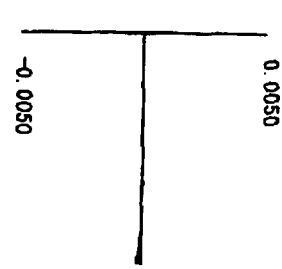
Figure 13:
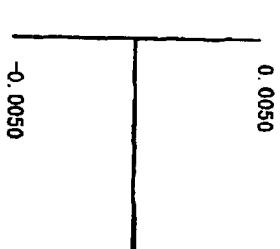

FIG. 13 shows longitudinal and lateral aberrations in this example. The aberrations are illustrated with respect to the reference wavelength and a wavelength of ±1 pm.

The refracting lens group L1 comprises, in an order from the object side, an aspherical positive lens of biconvex shape. The group L2 including a mirror comprises a first mirror M1 and a second mirror M2. Each of the first and second mirrors is a concave mirror having a concave surface facing the object side. The second imaging optical system comprises, in an order from the object side, an aspherical positive lens of meniscus shape having a convex surface facing the object side (this lens system may be considered to be a field optical system, and it may be or may not be included in the second imaging system), a diffractive optical element D1 having a positive refractive power, an aperture stop, a diffractive optical element D2 having a positive refractive power, two aspherical positive lenses of biconvex shape, and an aspherical positive lens having a convex surface facing the object side.

Each of the two diffractive optical elements has a minimum pitch of about 2.0 microns. Thus, when binary optics are used to produce this diffractive optical element and if an eight-level structure per pitch is to be formed, the smallest linewidth required for the smallest pitch of this diffractive optical element is about 0.25 micron.

Table 5 below shows numerical values corresponding to equations (10)–(12).

TABLE 5

| |Ld/LG2| | βG2 | LM1/Lo |
|---|---|---|
| D1 = 0.083  D2 = 0.001 | −0.22 | 0.21 |

In the examples described above, all the mirrors having a refractive power are formed with an aspherical surface. However, all the surfaces are not required to be aspherical. A spherical mirror may be used. Use of aspherical surfaces, however, is effective to correct aberrations much better.

There is an aspherical surface wherein the conical constant k is zero. However, the design may be made while taking the conical constant as a variable. Further, while one of the two surfaces defining a refracting lens is formed into an aspherical surface, both surfaces may be aspherical or, alternatively, the face opposite to the aspherical surface may be a flat surface. Further, one surface or both surfaces of a parallel flat plate may be formed into an aspherical surface.

Further, although an $F_2$ excimer laser having an emission wavelength of 157 nm was used as an exposure light source, an ArF excimer laser, for example, may be used. The invention is particularly effective when the wavelength is short and usable optical materials are limited, more specifically, the wavelength is not greater than 200 nm.

Further, although only fluorite was used as a glass material, if any other glass material becomes available with reference to $F_2$ excimer lasers, it may be used. In relation to the use of ArF excimer lasers, fluorite and quartz may be used in combination with good results of aberration correction. Of course, one of them may be used.

As regards the magnification of the whole optical system, a ratio of 1:4 was used. However, any other magnification such as 1:6 or 1:8, for example, may be used.

Further, although two diffractive optical elements are used, the present invention is not limited to this. Only one diffractive optical element may be used or, alternatively, many diffractive optical elements may be used. When plural diffractive optical elements are used, those diffractive optical elements having the same phase function may be used.

Further, although the exposure region has an arcuate shape, a rectangular shape or any other shape may be used, as long as it is defined within an exposure region where aberrations are corrected.

Tables 6–10 below show numerical examples concerning the specifications corresponding to Example 1 to Example 5 above. In these examples, $r_i$ is the curvature radius of the i-th lens surface in the order from the object side, $d_i$ is the thickness of the i-th lens or i-th air spacing in the order from the object side, $n_i$ is the refractive index of the glass material of the i-th lens in the order from the object side.

Also, the refractive indices of wavelengths +2 pm and −2 pm with respect to the reference wavelength of the $F_2$ laser are 1.5599949 and 1.5600051, respectively. Further, the shape of an aspherical surface can be given by the following equation:

$$X = \frac{\frac{H^2}{r_i}}{1+\left(1-(1+k)\cdot\left(\frac{H}{r_i}\right)^2\right)^{\frac{1}{2}}} + A\cdot H^4 + B\cdot H^6 + C\cdot H^B +$$
$$D\cdot H^{10} + E\cdot H^{12} + F\cdot H^{14} + G\cdot H^{16} + \ldots$$

where X is the amount of shift in the optical axis direction from the lens vertex, H is the distance from the optical axis, $r_i$ is the curvature radius, k is the conical constant, and A, B, . . . , G are aspherical surface coefficients.

The phase function φ(r) of the diffractive optical element is given as follows, where r is the distance from the optical axis and λ is the design wavelength in the numerical examples.

$$\phi(r) = (2\pi/\lambda)(C_1 r^2 + C_2 r^4 + C_3 r^6 + C_4 r^8 + C_5 r^{10} + \ldots)$$

Example 1

Distance from First Object to First Surface: 70.138 mm

| i | ri | di | ni | |
|---|---|---|---|---|
| 1 | −2762.442 | 18.000 | 1.56000 | |
| 2 | −399.532 | 1.000 | | |
| 3 | 558.553 | 25.576 | 1.56000 | |
| 4 | −214.414 | 171.921 | | |
| 5 | −312.537 | −161.921 | | M1 |
| 6 | 406.936 | 189.389 | | M2 |
| 7 | 356.569 | 23.253 | 1.56000 | |
| 8 | −453.004 | 506.682 | | Diffractive Optical Element |
| 9 | 0.000 | 10.000 | 1.56000 | |
| 10 | 0.000 | 63.309 | | |
| 11 | 0.0 (stop) | 1.008 | | |
| 12 | 0.000 | 10.000 | 1.56000 | |
| 13 | 0.000 | 8.575 | | Diffractive Optical Element |
| 14 | 626.401 | 35.000 | 1.56000 | |
| 15 | −333.974 | 79.668 | | |
| 16 | 238.618 | 35.000 | 1.56000 | |
| 17 | −619.121 | 6.883 | | |
| 18 | 95.677 | 35.000 | 1.56000 | |
| 19 | 342.050 | | | |

| aspherical surfaces | | | | | |
|---|---|---|---|---|---|
| i | K | A | B | C | D |
| 2 | 0.000000e+000 | 2.128391e−008 | −6.468606e−012 | −2.457597e−016 | 1.814504e−020 |
| 4 | 0.000000e+000 | 1.641133e−009 | 6.922093e−012 | −2.015931e−016 | 3.738140e−020 |

-continued

| | | | | | |
|---|---|---|---|---|---|
| 5 | 0.000000e+000 | 1.083740e−007 | −8.231635e−013 | 9.084428e−015 | −8.950845e−018 |
| 6 | 0.000000e+000 | −7.348435e−009 | 1.960647e−013 | 4.904284e−019 | 7.408717e−022 |
| 8 | 0.000000e+000 | 8.668391e−009 | −1.758747e−013 | 5.650018e−017 | −1.023943e−020 |
| 14 | 0.000000e+000 | 1.231504e−008 | −1.287668e−012 | 1.795636e−018 | −8.688361e−022 |
| 16 | 0.000000e+000 | 1.572717e−008 | 1.890492e−011 | −1.372265e−015 | 5.789546e−020 |
| 18 | 0.000000e+000 | −2.226921e−008 | −3.849648e−011 | −4.462957e−015 | 4.380898e−020 |

| i | E | F | G |
|---|---|---|---|
| 2 | −4.827823e−024 | 5.475221e−028 | 0.000000e+000 |
| 4 | −1.307747e−024 | −2.107435e−028 | 0.000000e+000 |
| 5 | 2.470538e−021 | −9.649621e−028 | 0.000000e+000 |
| 6 | −3.301314e−025 | 2.880002e−029 | 0.000000e+000 |
| 8 | 1.024211e−024 | −4.305381e−029 | 0.000000e+000 |
| 14 | −1.820368e−024 | 8.540871e−029 | 0.000000e+000 |
| 16 | 7.579491e−024 | −7.515667e−028 | 0.000000e+000 |
| 18 | −2.781699e−022 | 1.992138e−026 | 0.000000e+000 |

Example 2

| i | ri | di | ni | Obj-distance = 70.138 |
|---|---|---|---|---|
| 1 | −555.578 | 22.012 | 1.56000 | |
| 2 | −292.149 | 1.000 | | |
| 3 | 2558.756 | 25.576 | 1.56000 | |
| 4 | −166.437 | 188.149 | | |
| 5 | −336.169 | −178.149 | M1 | |
| 6 | 448.899 | 195.456 | M2 | |
| 7 | 401.946 | 23.253 | 1.56000 | |
| 8 | −403.602 | 499.775 | | |
| 9 | 0.000 | 10.000 | 1.56000 | |
| 10 | 0.000 | 33.776 | | |
| 11 | 0.0 (stop) | 35.259 | | |
| 12 | 0.000 | 10.000 | 1.56000 | |
| 13 | 0.000 | 18.767 | | |
| 14 | 1159.629 | 19.656 | 1.56000 | |
| 15 | −345.388 | 1.000 | | |
| 16 | 131.936 | 28.435 | 1.56000 | |
| 17 | 224.124 | 6.449 | | |
| 18 | 358.999 | 31.867 | 1.56000 | |
| 19 | 115.724 | 7.580 | | |
| 20 | 187.254 | 37.000 | 1.56000 | |
| 21 | −320.754 | 1.000 | | |
| 22 | 97.472 | 37.000 | 1.56000 | |
| 23 | 267.502 | | | | aspherical surfaces

| i | K | A | B | C | D |
|---|---|---|---|---|---|
| 2 | 0.000000e+000 | 2.988994e−008 | −6.382928e−012 | −4.437456e−016 | 3.239065e−020 |
| 4 | 0.000000e+000 | 1.072435e−008 | 5.530139e−012 | 2.204553e−018 | −2.736735e−020 |
| 5 | 0.000000e+000 | 7.884656e−008 | −5.301436e−012 | 2.342867e−016 | −8.904030e−019 |
| 6 | 0.000000e+000 | −7.343414e−009 | 1.256438e−013 | 2.039327e−018 | 1.593793e−022 |
| 8 | 0.000000e+000 | 6.447098e−009 | −5.702305e−014 | 2.811889e−018 | 9.786429e−022 |
| 14 | 0.000000e+000 | 9.954353e−009 | −1.222878e−012 | 7.019205e−017 | −9.086299e−021 |
| 20 | 0.000000e+000 | 4.070401e−008 | 2.420260e−011 | −2.619025e−015 | 2.625291e−019 |
| 22 | 0.000000e+000 | −2.992858e−008 | −3.243400e−011 | −1.827633e−015 | −4.670577e−019 |

| i | E | F | G |
|---|---|---|---|
| 2 | −1.083678e−023 | 9.879943e−028 | 0.000000e+000 |
| 4 | 1.018055e−023 | −8.825224e−028 | 0.000000e+000 |
| 5 | 3.479851e−022 | −6.062478e−026 | 0.000000e+000 |
| 6 | −1.314002e−025 | 1.039782e−029 | 0.000000e+000 |
| 8 | −9.983269e−026 | 1.305787e−030 | 0.000000e+000 |
| 14 | 4.952859e−025 | −2.706623e−029 | 0.000000e+000 |
| 20 | −1.930540e−023 | 5.435958e−028 | 0.000000e+000 |
| 22 | −7.279457e−023 | 7.047478e−027 | 0.000000e+000 |

-continued

HOE surfaces

| i | C1 | C2 | C3 | C4 | C5 |
|---|---|---|---|---|---|
| 9 | 7.258941e−004 | −2.816325e−008 | −5.114866e−014 | 0.000000e+000 | 0.000000e+000 |
| 13 | 5.954071e−004 | −7.587706e−009 | −9.857974e−013 | 0.000000e+000 | 0.000000e+000 |

Example 3

| i | ri | di | ni | Obj-distance = 68.238 |
|---|---|---|---|---|
| 1 | −628.549 | 18.000 | 1.56000 | |
| 2 | −400.000 | 1.156 | | |
| 3 | 237.446 | 24.168 | 1.56000 | |
| 4 | −584.866 | 220.411 | | |
| 5 | −191.564 | 24.572 | 1.56000 | |
| 6 | −456.235 | 2.714 | | |
| 7 | −287.559 | −2.714 | M1 | |
| 8 | −456.235 | −24.572 | 1.56000 | |
| 9 | −191.564 | −210.411 | | |
| 10 | 626.588 | 298.657 | M2 | |
| 11 | 264.313 | 29.512 | 1.56000 | |
| 12 | −944.879 | 479.022 | | |
| 13 | 0.000 | 10.000 | 1.56000 | |
| 14 | 0.000 | 59.858 | | |
| 15 | 0.0 (stop) | 1.000 | | |
| 16 | 0.000 | 10.000 | 1.56000 | |
| 17 | 0.000 | 1.000 | | |
| 18 | 135.000 | 26.636 | 1.56000 | |
| 19 | 188.482 | 48.819 | | |
| 20 | 120.000 | 32.500 | 1.56000 | |
| 21 | −410.282 | 19.310 | | |
| 22 | 102.069 | 29.133 | 1.56000 | |
| 23 | 0.000 | | | | aspherical surfaces

| i | K | A | B | C | D |
|---|---|---|---|---|---|
| 2 | 0.000000e+000 | 2.493793e−008 | −5.598710e−012 | −1.038264e−016 | 2.163582e−020 |
| 4 | 0.000000e+000 | −1.074488e−008 | 7.677562e−012 | −6.075624e−016 | 4.435628e−020 |
| 5 | 0.000000e+000 | −1.771367e−008 | −4.429027e−012 | 3.722296e−015 | −1.456801e−018 |
| 7 | 0.000000e+000 | 7.728940e−009 | 1.155240e−012 | 1.644424e−015 | −5.308747e−019 |
| 9 | 0.000000e+000 | −1.771367e−008 | −4.429027e−012 | 3.722296e−015 | −1.456801e−018 |
| 10 | 0.000000e+000 | −4.157583e−009 | 8.141977e−014 | 1.615963e−018 | 3.214400e−022 |
| 12 | 0.000000e+000 | 1.356704e−008 | −1.897035e−013 | 1.115481e−017 | −3.256260e−021 |
| 18 | 0.000000e+000 | 3.711673e−008 | 9.195962e−013 | 1.864848e−016 | −4.130019e−020 |
| 20 | 0.000000e+000 | −2.293730e−007 | −1.175638e−011 | −4.603030e−016 | 1.824753e−019 |
| 22 | 0.000000e+000 | 1.686911e−007 | 4.302865e−011 | 6.552415e−015 | −2.329619e−018 |

| i | E | F | G |
|---|---|---|---|
| 2 | −2.502558e−024 | 1.655468e−028 | 0.000000e+000 |
| 4 | −2.689531e−024 | 3.201159e−029 | 0.000000e+000 |
| 5 | 9.767799e−022 | −1.159244e−025 | 0.000000e+000 |
| 7 | 3.526786e−022 | −4.164371e−026 | 0.000000e+000 |
| 9 | 9.767799e−022 | −1.159244e−025 | 0.000000e+000 |
| 10 | −2.958951e−026 | 5.128353e−031 | 0.000000e+000 |
| 12 | 1.535275e−025 | −2.389171e−030 | 0.000000e+000 |
| 18 | 7.981582e−024 | −6.489593e−028 | 0.000000e+000 |
| 20 | −4.973576e−023 | 5.909887e−027 | 0.000000e+000 |
| 22 | 1.595410e−021 | −4.013024e−025 | 0.000000e+000 |

HOE surfaces

| i | C1 | C2 | C3 | C4 | C5 |
|---|---|---|---|---|---|
| 14 | 1.017755e−003 | −5.058745e−008 | 8.433401e−015 | −1.032705e−018 | 3.172816e−023 |
| 17 | 5.148019e−004 | 2.786775e−008 | −2.624114e−012 | 5.484800e−017 | −4.631525e−022 |

Example 4

| i | ri | di | ni | Obj-distance = 58.499 |
|---|---|---|---|---|
| 1 | 699.691 | 33.706 | 1.56000 | |
| 2 | −486.007 | 18.806 | | |
| 3 | −364.452 | 20.531 | 1.56000 | |
| 4 | 593.003 | 104.397 | | |
| 5 | 620.381 | 27.468 | 1.56000 | |
| 6 | −538.238 | 682.098 | | |
| 7 | −291.989 | 30.415 | 1.56000 | |
| 8 | 3831.912 | 69.406 | | |
| 9 | −398.872 | −69.406 | M1 | |
| 10 | 3831.912 | −30.415 | 1.56000 | |
| 11 | −291.989 | −682.098 | | |
| 12 | −538.238 | −27.468 | 1.56000 | |
| 13 | 620.381 | −4.943 | | |
| 14 | 0.000 | 504.609 | M2 | |
| 15 | −692.782 | 19.458 | 1.56000 | |
| 16 | −430.908 | 290.815 | | |
| 17 | 0.000 | 10.000 | 1.56000 | |
| 18 | 0.000 | 221.443 | | |
| 19 | 0.0 (stop) | 16.287 | | |
| 20 | 0.000 | 10.000 | 1.56000 | |
| 21 | 0.000 | 1.360 | | |
| 22 | 300.000 | 46.909 | 1.56000 | |
| 23 | −4015.088 | 68.510 | | |
| 24 | 220.000 | 46.794 | 1.56000 | |
| 25 | −1164.015 | 85.157 | | |
| 26 | 265.993 | 47.000 | 1.56000 | |
| 27 | −578.340 | | | | aspherical surfaces

| i | K | A | B | C | D |
|---|---|---|---|---|---|
| 1 | 0.000000e+000 | −1.681866e−009 | 2.986153e−013 | −5.223610e−019 | 2.824161e−021 |
| 3 | 0.000000e+000 | 8.458325e−009 | −2.072192e−013 | −1.342548e−018 | −1.997125e−021 |
| 6 | 0.000000e+000 | 2.854928e−009 | 2.852185e−015 | 1.944709e−019 | 1.479079e−023 |
| 7 | 0.000000e+000 | 5.949273e−009 | 1.353698e−013 | 2.886980e−018 | 2.989787e−022 |
| 9 | 0.000000e+000 | −7.781800e−012 | 5.197164e−015 | 1.092259e−019 | 1.709278e−023 |
| 11 | 0.000000e+000 | 5.949273e−009 | 1.353698e−013 | 2.888980e−018 | 2.989787e−022 |
| 12 | 0.000000e+000 | 2.854928e−009 | 2.852185e−015 | 1.944709e−019 | 1.479079e−023 |
| 15 | 0.000000e+000 | −5.267907e−009 | 1.973015e−014 | 2.804847e−019 | 8.885808e−024 |
| 22 | −3.224608e+000 | −8.290887e−009 | −4.384285e−013 | −1.210442e−018 | −1.082590e−022 |
| 24 | 0.000000e+000 | −7.333591e−009 | 2.665449e−013 | −8.665404e−019 | −3.588834e−022 |
| 26 | 0.000000e+000 | −3.629113e−008 | −1.388388e−012 | −1.440922e−016 | 2.053203e−020 |

| i | E | F | G |
|---|---|---|---|
| 1 | −3.736212e−025 | 2.009467e−029 | 0.000000e+000 |
| 3 | 2.872877e−025 | −1.766891e−029 | 0.000000e+000 |
| 5 | 2.402849e−028 | −5.549594e−032 | 0.000000e+000 |
| 7 | −1.486784e−028 | 5.643220e−031 | 0.000000e+000 |
| 9 | −5.671144e−028 | 2.416267e−032 | 0.000000e+000 |
| 11 | −1.486784e−026 | 5.643220e−031 | 0.000000e+000 |
| 12 | 2.402849e−028 | −5.549594e−032 | 0.000000e+000 |
| 15 | 3.538947e−028 | −2.714265e−032 | 0.000000e+000 |
| 22 | 2.100909e−027 | −9.830355e−032 | 0.000000e+000 |
| 24 | 1.160342e−028 | −2.641121e−031 | 0.000000e+000 |
| 26 | −2.539599e−024 | 1.018509e−028 | 0.000000e+000 |

HOE surfaces

| i | C1 | C2 | C3 | C4 | C5 |
|---|---|---|---|---|---|
| 17 | 3.183763e−004 | −4.046038e−010 | −3.716434e−014 | −1.759133e−020 | −7.321876e−024 |
| 20 | 6.283687e−005 | 6.771151e−009 | 4.215758e−014 | 8.709241e−019 | 3.561099e−023 |

Example 5

| i | ri | di | ni | Obj-distance = 91.815 |
|---|---|---|---|---|
| 1 | 388.248 | 26.576 | 1.56000 | |
| 2 | −227.688 | 207.007 | | |

-continued

| | | | | |
|---|---|---|---|---|
| 3 | −353.388 | −167.747 | | M1 |
| 4 | 358.429 | 225.262 | | M2 |
| 5 | 221.017 | 23.251 | 1.56000 | |
| 6 | 1302.040 | 477.676 | | Diffractive Optical Element |
| 7 | 0.000 | 10.000 | 1.56000 | |
| 8 | 0.000 | 78.111 | | |
| 9 | 0.0 (stop) | 1.000 | | |
| 10 | 0.000 | 10.000 | 1.56000 | |
| 11 | 0.000 | 3.436 | | Diffractive Optical Element |
| 12 | 522.657 | 21.472 | 1.56000 | |
| 13 | −403.587 | 75.388 | | |
| 14 | 235.246 | 29.764 | 1.56000 | |
| 15 | −400.343 | 1.000 | | |
| 16 | 85.000 | 37.000 | 1.56000 | |
| 17 | 444.705 | | | | aspherical surfaces

| i | K | A | B | C | D |
|---|---|---|---|---|---|
| 4 | 0.000000e+000 | 7.281534e−000 | 1.535484e−013 | −4.370275e−017 | 9.876687e−021 |
| 5 | 0.000000e+000 | 2.209506e−007 | 8.894123e−011 | 8.536915e−015 | −5.523997e−017 |
| 6 | 0.000000e+000 | −3.188788e−010 | 1.064840e−013 | −2.885073e−017 | 7.084915e−021 |
| 9 | 0.000000e+000 | 1.902934e−008 | −2.320265e−013 | 1.279193e−016 | −4.088628e−020 |
| 18 | 0.000000e+000 | 1.842631e−008 | −5.073137e−013 | 1.372926e−016 | −1.050483e−020 |
| 20 | 0.000000e+000 | 2.306267e−008 | 1.672101e−011 | −1.060023e−015 | 4.230949e−020 |
| 22 | 0.000000e+000 | −8.862686e−008 | −2.792881e−011 | −4.848843e−015 | −2.831508e−019 |

| i | E | F | G |
|---|---|---|---|
| 4 | −1.058492e−024 | 4.868297e−029 | 0.000000e+000 |
| 5 | 2.248477e−020 | 6.628828e−024 | 0.000000e+000 |
| 6 | −1.347591e−024 | 1.040897e−028 | 0.000000e+000 |
| 9 | 6.899515e−024 | −4.448103e−028 | 0.000000e+000 |
| 18 | −4.135322e−024 | 3.704107e−028 | 0.000000e+000 |
| 20 | −1.206693e−024 | −1.271080e−028 | 0.000000e+000 |
| 22 | 6.124698e−029 | −8.733653e−027 | 0.000000e+000 |

HOE surfaces

| i | C1 | C2 | C3 | C4 | C5 |
|---|---|---|---|---|---|
| 13 | 9.272146e−004 | −3.752225e−008 | −2.193748e−013 | 9.832534e−018 | 2.954594e−021 |
| 17 | 7.020836e−004 | −2.961051e−009 | −1.044485e−012 | −1.326484e−016 | 1.395201e−021 |

| i | C6 | C7 | C8 |
|---|---|---|---|
| 13 | −4.151536e−025 | 2.213188e−025 | 0.000000e+000 |
| 17 | 2.493462e−024 | −2.158400e−028 | 0.000000e+000 |

In the embodiments and examples of the present invention as described hereinbefore, a projection optical system which assures a large numerical aperture and a wide exposure area can be accomplished.

While the invention has been described with reference to the structures disclosed herein, it is not confined to the details set forth and this application is intended to cover such modifications or changes as may come within the purposes of the improvements or the scope of the following claims.

What is claimed is:

1. A projection optical system, comprising:
a first imaging optical system having at least one first lens and at least one concave mirror, for forming an intermediate image on the basis of only abaxial light received from an object;
a second imaging optical system having at least one second lens and at least one diffractive optical element, for projecting an image of the object onto an image plane different from the position at which the intermediate image is formed; and
a field optical system disposed between said first and second imaging optical systems, said field optical system having at least one third lens,
wherein said second imaging optical system has no mirror.

2. A projection optical system according to claim 1, wherein said at least one first lens, said at least one concave mirror, said at least one second lens, and said at least one diffractive optical element have a positive power.

3. A projection optical system according to claim 1, wherein said first and second imaging optical systems are disposed along a common straight optical axis, and wherein abaxial light from the object as reflected and collected by said concave mirror passes through an outside portion of an effective diameter of said concave mirror, toward the image plane side.

4. A projection optical system according to claim 1, wherein at least one of said at least one diffractive optical element of said projection optical system satisfies a relation:

$$3 < MP/\lambda < 50$$

where MP is a minimum pitch (micron) of the diffractive optical element, and $\lambda$ is the exposure wavelength (micron).

5. A projection optical system according to claim 1, further comprising a field stop adjacent to an intermediate image to be formed by said first imaging optical system.

6. A device manufacturing method, comprising the steps of:
exposing a wafer to a device pattern using a projection optical system according to claim 1; and
developing the exposed wafer.

7. An exposure apparatus including a projection optical system as recited in claim 1, for projecting a pattern of a mask onto a substrate.

8. A projection optical system comprising:
a first imaging optical system having at least one first lens with a positive power and at least one concave mirror, for forming an intermediate image of an object;
a second imaging optical system having at least one second lens with a positive power and at least one diffractive optical element with a positive power, for projecting the intermediate image onto an image plane; and
a field optical system disposed between said first and second imaging optical systems,
wherein said projection optical system does not include a lens having a negative power,
wherein said projection optical system does not include a mirror having a negative power, and
wherein said projection optical system does not include a diffractive optical element having a negative power.

9. A device manufacturing method, comprising the steps of:
exposing a wafer to a device pattern using a projection optical system according to claim 8; and
developing the exposed wafer.

10. An exposure apparatus including a projection optical system as recited in claim 8, for projecting a pattern of a mask onto a substrate.

11. A projection optical system comprising:
a first imaging optical system having at least one first lens and a single concave mirror, for forming an intermediate image of an object;
a second imaging optical system having at least one second lens and at least one diffractive optical element, for projecting an image of the object onto an image plane different from the position at which the intermediate image is formed; and
a flat mirror disposed between said first and second imaging optical systems and at a position adjacent to the position at which the intermediate image is formed,
wherein said projection optical system does not include a mirror having a power, except the single concave mirror of said first imaging optical system.

12. A device manufacturing method, comprising the steps of:
exposing a wafer to a device pattern using a projection optical system according to claim 11; and
developing the exposed wafer.

13. An exposure apparatus including a projection optical system as recited in claim 11, for projecting a pattern of a mask onto a substrate.

14. A projection optical system comprising:
a first imaging optical system having at least one first lens and at least one concave mirror, for forming an intermediate image of an object;
a second imaging optical having at least one second lens and at least one diffractive optical element, for projecting the intermediate image onto an image plane; and
a field optical system disposed between said first and second imaging optical systems,
wherein at least one of said at least one diffractive optical element of said projection optical system satisfies a relation:

$|Ld/Lg2|<0.2$ where Ld is the distance between an aperture stop of said second imaging optical system and said diffractive optical element, and Lg2 is the distance from a paraxial image plane position of the intermediate image to the image plane.

15. A device manufacturing method, comprising the steps of:
exposing a wafer to a device pattern using a projection optical system according to claim 14; and
developing the exposed wafer.

16. An exposure apparatus including a projection optical system as recited in claim 14, for projecting a pattern of a mask onto a substrate.

17. A projection optical system, comprising:
at least two lenses;
at least one concave mirror;
at least one diffractive optical element;
a first imaging optical system having one of said at least two lenses and said at least one concave mirror, for imaging an intermediate image of an object, wherein said first imaging optical system includes at least a lens having a positive refractive power, a reflection mirror and said concave mirror, which are disposed in the order mentioned above, from the object side; and
a second imaging optical system having another one lens of said at least two lenses and said at least one diffractive optical element, for projecting the intermediate image onto an image plane,
wherein said first and second imaging optical systems are disposed along a common straight optical axis, and wherein abaxial light from the object as reflected and collected by said concave mirror passes through an outside portion of an effective diameter of said concave mirror, toward the image plane side.

18. A projection optical system according to claim 17, wherein said at least two lenses, said at least one concave mirror and said at least one diffractive optical element have a positive refractive power, respectively, and wherein said projection optical system does not include a lens having a negative power, a mirror having a negative power, or a diffractive optical element having a negative refractive power.

19. A projection optical system according to claim 17, wherein said at least two lenses, said at least one concave mirror and said at least one diffractive optical element include a lens, a concave mirror and a diffractive optical element of a positive power.

20. A projection optical system according to claim 17, further comprising a field optical system disposed between said first and second imaging optical systems.

21. A projection optical system according to claim 17, further comprising a lens group disposed between said reflection mirror and said concave mirror.

22. A projection optical system according to claim 21, wherein said lens group has a negative refractive power and is disposed between said concave mirror and a lens, in said first imaging optical system, having a positive power.

23. A projection optical system according to claim 17, further comprising a reflection surface disposed adjacent to an intermediate image formed by said first imaging optical system, and wherein abaxial light from the object as reflected and collected by said concave mirror is deflected by said reflection surface toward said second imaging optical system.

24. A projection optical system according to claim 17, wherein at least one of said at least one diffractive optical element of said projection optical system satisfies a relation:

$$3 < MP/\lambda < 50$$

where MP is a minimum pitch (micron) of the diffractive optical element, and $\lambda$ is the exposure wavelength (micron).

25. A projection optical system according to claim 17, wherein at least one of said at least one diffractive optical element of said projection optical system satisfies a relation:

$$|Ld/Lg2| < 0.2$$

where Ld is the distance between an aperture stop of said second imaging optical system and said diffractive optical element, and Lg2 is the distance from a paraxial image plane position of an intermediate image formed by said first imaging optical system, corresponding to an object point position of said second imaging optical system, to a re-imaging plane where the intermediate image is re-imaged.

26. A projection optical system according to claim 17, further comprising a field stop adjacent to an intermediate image to be formed by said first imaging optical system.

27. A device manufacturing method, comprising the steps of:

exposing a wafer to a device pattern using a projection optical system according to claim 17; and developing the exposed wafer.

28. An exposure apparatus including a projection optical system as recited in claim 17, for projecting a pattern of a mask onto a substrate.

* * * * *

UNITED STATES PATENT AND TRADEMARK OFFICE
CERTIFICATE OF CORRECTION

PATENT NO.     : 6,829,099 B2
DATED          : December 7, 2004
INVENTOR(S)    : Takashi Kato et al.

It is certified that error appears in the above-identified patent and that said Letters Patent is hereby corrected as shown below:

Column 2,
Line 14, "diffrative" should read -- diffractive --.

Column 3,
Line 64, "including many" should read -- include a lens group of negative refractive power as well as many additional lenses. Further, the second imaging system should include many --.

Column 7,
Line 4, "$\emptyset_0$__" should read -- $v_0$__ --.

Column 8,
Line 8, "+$\emptyset_0$__/$v_0$__ is" should read -- +$\emptyset_0$_/$v_0$_ --.
Line 11, "determines" should read -- determine --.

Column 9,
Line 16, "pull." should read -- pupil --.
Line 40, "a feature" should read -- features --.

Column 10,
Line 25, "power." should read -- powers. --.

Column 12,
Line 17, "position M1 the" should read -- position of the first mirror M1 with --.
Line 38, "As regards" should read -- In regards to --.

Column 13,
Line 33, "L—about" should read -- L = about --.

Column 14,
Line 25, "or or" should read -- or --.
Line 44, "of an" should read -- or an --.

Column 16,
Line 31, "provisions" should read -- provision --.
Line 46, "or or" should read -- or --.

UNITED STATES PATENT AND TRADEMARK OFFICE
CERTIFICATE OF CORRECTION

PATENT NO. : 6,829,099 B2
DATED : December 7, 2004
INVENTOR(S) : Takashi Kato et al.

It is certified that error appears in the above-identified patent and that said Letters Patent is hereby corrected as shown below:

Column 18,
Line 56, "As regards" should read -- In regards to --.
Line 58, "be" should be deleted.

Column 19,
Line 31, "As regards" should read -- In regards to --.

Column 21,
Line 33, "As regards" should read -- In regards to --.

Column 22,
Line 32, "φ(r)" should read -- ø(r) --.
Line 37, "φ(r)" should read -- ø(r) --.

Column 23,
In the top-most chart, in the next to the last column, in the line for i = 14, "1.795636e-018" should read -- 1.795636e-016 --.
In the second table down from the top, under column "F," the fifth entry down, "-4305381e-029" should read -- 4.305361e-029 --.
In the chart entitled "aspherical surfaces," in the upper level, in column "C," the second entry down, "2.204553e-018" should read -- 2.204553e-016 --; the third entry down, "2.342867e-016" should read -- 2.342867e-015 --; and the sixth entry down, "7.019205e-017" should read -- 7.019206e-017 --.
Continuing in the chart entitled "aspherical surfaces," in the lower level, in column "E," the third entry down, "3.479851e-022" should read -- 3.479651e-022 --; and the fifth entry down "-9.983269e-026" should read -- -9.983259e-026 --.

Column 25,
In the chart entitled "HOE surfaces," in column "C3," the first-listed entry "-5.114866e-014" should read -- 5.114855e-014 --.
In the chart under "Example 3," in column "di," the third entry down, "24.168" should read -- 24.160 --.
In the chart entitled "aspherical surfaces," in the upper level, under column "A," the seventh entry down, "1.356704e-008" should read -- 1.355704e-008 --; under column "C," the second entry down, "-6.075624e-016" should read -- -5.075624e-015 -- and the seventh entry down, "1.115481e-017" should read -- 3.115481e-017 --.
In the chart entitled "aspherical surfaces," in the lower level, under column "E," the sixth entry down, "-2.958951e-026" should read -- -2.958961e-026 -- and the eighth entry down, "7.981582e-024" should read -- 7.961582e-024 --.

UNITED STATES PATENT AND TRADEMARK OFFICE
CERTIFICATE OF CORRECTION

PATENT NO. : 6,829,099 B2
DATED : December 7, 2004
INVENTOR(S) : Takashi Kato et al.

It is certified that error appears in the above-identified patent and that said Letters Patent is hereby corrected as shown below:

Column 27,
In the header row for the first table under "Example 4," "Obj-distance = 58.499" should read -- Obj-distance = 68.499 -- and under column "di," the twenty-first entry down "1.360" should read -- 3.360 --.
The chart entitled "aspherical surfaces" should be deleted and the following inserted therefor:

aspherical surfaces

| i | K | A | B | C | D |
|---|---|---|---|---|---|
| 1 | 0.000000e+000 | -1.681866e-009 | 2.986153e-013 | -5.223610e-019 | 2.824161e-021 |
| 3 | 0.000000e+000 | 6.458325e-009 | -2.072192e-013 | -1.342548e-018 | -1.997125e-021 |
| 6 | 0.000000e+000 | 2.854128e-009 | 2.852185e-015 | 1.944709e-019 | 1.479079e-023 |
| 7 | 0.000000e+000 | 6.948271e-009 | 1.353698e-013 | 2.886980e-018 | 2.989787e-022 |
| 9 | 0.000000e+000 | -7.761800e-012 | 6.197164e-015 | 1.092259e-019 | 1.709278e-023 |
| 11 | 0.000000e+000 | 5.948273e-009 | 1.353698e-013 | 2.886980e-018 | 2.989787e-022 |
| 12 | 0.000000e+000 | 2.854128e-009 | 2.852185e-015 | 1.944709e-019 | 1.479079e-023 |
| 15 | 0.000000e+000 | -5.267907e-009 | 1.973015e-014 | 2.604847e-019 | 6.885808e-024 |
| 22 | -3.224606e+000 | -8.390881e-009 | -4.384285e-013 | -1.210442e-018 | -1.082590e-022 |
| 24 | 0.000000e+000 | -7.333591e-009 | 2.665449e-013 | -6.665404e-019 | -3.588634e-022 |
| 26 | 0.000000e+000 | -1.629113e-008 | -1.383388e-012 | -1.440922e-018 | 2.053203e-020 |

| i | E | F | G |
|---|---|---|---|
| 1 | -1.736212e-025 | 2.009467e-029 | 0.000000e+000 |
| 3 | 2.672877e-025 | -1.766891e-029 | 0.000000e+000 |
| 6 | 2.402849e-028 | -5.549594e-032 | 0.000000e+000 |
| 7 | -1.486784e-026 | 5.643220e-031 | 0.000000e+000 |
| 9 | -5.671144e-028 | 2.416267e-032 | 0.000000e+000 |
| 11 | -1.486784e-026 | 5.643220e-031 | 0.000000e+000 |
| 12 | 2.402849e-028 | -5.549594e-032 | 0.000000e+000 |
| 15 | 1.533947e-028 | -2.714265e-032 | 0.000000e+000 |
| 22 | 2.109909e-027 | -9.830355e-032 | 0.000000e+000 |
| 24 | 1.160342e-026 | -2.641121e-031 | 0.000000e+000 |
| 26 | -2.639599e-024 | 1.018509e-028 | 0.000000e+000 |

In "Example 5," under column "di," the first-listed entry, "26.576" should read -- 25.576 --.

Column 29,
In the top-most chart, in line "6," "477.676" should read -- 477.675 -- and in line "12," "75.388" should read -- 75.386 --.

UNITED STATES PATENT AND TRADEMARK OFFICE
CERTIFICATE OF CORRECTION

PATENT NO. : 6,829,099 B2
DATED : December 7, 2004
INVENTOR(S) : Takashi Kato et al.

It is certified that error appears in the above-identified patent and that said Letters Patent is hereby corrected as shown below:

Column 29 (cont'd),
The charts entitled "aspherical surfaces" and "HOE surfaces" should be deleted and the following inserted therefor:

[aspherical surfaces and HOE surfaces data tables]

Column 31,
Line 63, "optical" should read -- optical system --.

Signed and Sealed this

Tenth Day of May, 2005

JON W. DUDAS
*Director of the United States Patent and Trademark Office*